United States Patent
Gorisse et al.

(10) Patent No.: US 9,225,231 B2
(45) Date of Patent: Dec. 29, 2015

(54) OPEN LOOP RIPPLE CANCELLATION CIRCUIT IN A DC-DC CONVERTER

(71) Applicant: RF Micro Devices, Inc., Greensboro, NC (US)

(72) Inventors: Philippe Gorisse, Brax (FR); Nadim Khlat, Cugnaux (FR); Christopher Truong Ngo, Queen Creek, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 227 days.

(21) Appl. No.: 14/027,416

(22) Filed: Sep. 16, 2013

(65) Prior Publication Data
US 2014/0077787 A1    Mar. 20, 2014

Related U.S. Application Data

(60) Provisional application No. 61/701,114, filed on Sep. 14, 2012.

(51) Int. Cl.
| | |
|---|---|
| H02M 1/14 | (2006.01) |
| H02M 1/15 | (2006.01) |
| H03F 1/02 | (2006.01) |
| H02M 1/00 | (2007.01) |

(52) U.S. Cl.
CPC *H02M 1/14* (2013.01); *H02M 1/15* (2013.01); *H03F 1/0211* (2013.01); *H03F 1/0261* (2013.01); *H02M 2001/0045* (2013.01)

(58) Field of Classification Search
CPC ......... H02M 1/14; H02M 1/143; H02M 1/15; H02M 3/1584; H02M 2001/0045
See application file for complete search history.

(56) References Cited

U.S. PATENT DOCUMENTS

| | | |
|---|---|---|
| 3,969,682 A | 7/1976 | Rossum |
| 3,980,964 A | 9/1976 | Grodinsky |

(Continued)

FOREIGN PATENT DOCUMENTS

| | | |
|---|---|---|
| CN | 1211355 A | 3/1999 |
| CN | 1518209 A | 8/2004 |

(Continued)

OTHER PUBLICATIONS

Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.

(Continued)

*Primary Examiner* — Harry Behm
(74) *Attorney, Agent, or Firm* — Withrow & Terranova, P.L.L.C.

(57) ABSTRACT

A direct current (DC)-DC converter, which includes an open loop ripple cancellation circuit, a switching supply, and a parallel amplifier, is disclosed. During a calibration mode, the parallel amplifier provides a parallel amplifier output current to regulate a power supply output voltage based on a calibration setpoint. The switching supply drives the parallel amplifier output current toward zero using a switching control signal, such that during the calibration mode, an estimate of a current gain is based on the switching control signal. Further, during the calibration mode, the open loop ripple cancellation circuit is disabled. During a normal operation mode, the open loop ripple cancellation circuit provides a ripple cancellation current, which is based on the estimate of the current gain.

26 Claims, 11 Drawing Sheets

(56) References Cited

U.S. PATENT DOCUMENTS

| | | |
|---|---|---|
| 4,587,552 A | 5/1986 | Chin |
| 4,692,889 A | 9/1987 | McNeely |
| 4,831,258 A | 5/1989 | Paulk et al. |
| 4,996,500 A | 2/1991 | Larson et al. |
| 5,099,203 A | 3/1992 | Weaver et al. |
| 5,146,504 A | 9/1992 | Pinckley |
| 5,187,396 A | 2/1993 | Armstrong, II et al. |
| 5,311,309 A | 5/1994 | Ersoz et al. |
| 5,317,217 A | 5/1994 | Rieger et al. |
| 5,351,087 A | 9/1994 | Christopher et al. |
| 5,414,614 A | 5/1995 | Fette et al. |
| 5,420,643 A | 5/1995 | Romesburg et al. |
| 5,457,620 A | 10/1995 | Dromgoole |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedmann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow |
| 6,133,777 A | 10/2000 | Savelli |
| 6,141,541 A | 10/2000 | Midya et al. |
| 6,147,478 A | 11/2000 | Skelton et al. |
| 6,166,598 A | 12/2000 | Schlueter |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,400,775 B1 | 6/2002 | Gourgue et al. |
| 6,483,281 B2 | 11/2002 | Hwang |
| 6,559,689 B1 | 5/2003 | Clark |
| 6,566,935 B1 | 5/2003 | Renous |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 | 3/2004 | Lam |
| 6,703,080 B2 | 3/2004 | Reyzelman et al. |
| 6,728,163 B2 | 4/2004 | Gomm et al. |
| 6,744,151 B2 | 6/2004 | Jackson et al. |
| 6,819,938 B2 | 11/2004 | Sahota |
| 6,885,176 B2 | 4/2005 | Librizzi |
| 6,958,596 B1 | 10/2005 | Sferrazza et al. |
| 6,995,995 B2 | 2/2006 | Zeng et al. |
| 7,038,536 B2 | 5/2006 | Cioffi et al. |
| 7,043,213 B2 | 5/2006 | Robinson et al. |
| 7,053,718 B2 | 5/2006 | Dupuis et al. |
| 7,058,373 B2 | 6/2006 | Grigore |
| 7,099,635 B2 | 8/2006 | McCune |
| 7,164,893 B2 | 1/2007 | Leizerovich et al. |
| 7,170,341 B2 | 1/2007 | Conrad et al. |
| 7,200,365 B2 | 4/2007 | Watanabe et al. |
| 7,233,130 B1 | 6/2007 | Kay |
| 7,253,589 B1 | 8/2007 | Potanin et al. |
| 7,254,157 B1 | 8/2007 | Crotty et al. |
| 7,262,658 B2 | 8/2007 | Ramaswamy et al. |
| 7,279,875 B2 | 10/2007 | Gan et al. |
| 7,304,537 B2 | 12/2007 | Kwon et al. |
| 7,348,847 B2 | 3/2008 | Whittaker |
| 7,394,233 B1 | 7/2008 | Trayling et al. |
| 7,405,618 B2 | 7/2008 | Lee et al. |
| 7,411,316 B2 | 8/2008 | Pai |
| 7,414,330 B2 | 8/2008 | Chen |
| 7,454,238 B2 | 11/2008 | Vinayak et al. |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,684,216 B2 | 3/2010 | Choi et al. |
| 7,696,735 B2 | 4/2010 | Oraw et al. |
| 7,715,811 B2 | 5/2010 | Kenington |
| 7,724,837 B2 | 5/2010 | Filimonov et al. |
| 7,755,431 B2 | 7/2010 | Sun |
| 7,764,060 B2 | 7/2010 | Wilson |
| 7,773,691 B2 | 8/2010 | Khlat et al. |
| 7,773,965 B1 | 8/2010 | Van Brunt et al. |
| 7,777,459 B2 | 8/2010 | Williams |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,852,150 B1 | 12/2010 | Arknaes-Pedersen |
| 7,856,048 B1 | 12/2010 | Smaini et al. |
| 7,859,336 B2 | 12/2010 | Markowski et al. |
| 7,880,547 B2 | 2/2011 | Lee et al. |
| 7,884,681 B1 | 2/2011 | Khlat et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,920,023 B2 | 4/2011 | Witchard |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,044,639 B2 | 10/2011 | Tamegai et al. |
| 8,054,126 B2 | 11/2011 | Yang et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,242,813 B1 | 8/2012 | Wile et al. |
| 8,253,485 B2 | 8/2012 | Clifton |
| 8,253,487 B2 | 8/2012 | Hou et al. |
| 8,274,332 B2 | 9/2012 | Cho et al. |
| 8,289,084 B2 | 10/2012 | Morimoto et al. |
| 8,362,837 B2 | 1/2013 | Koren et al. |
| 8,493,141 B2 | 7/2013 | Khlat et al. |
| 8,519,788 B2 | 8/2013 | Khlat |
| 8,541,993 B2 | 9/2013 | Notman et al. |
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,571,498 B2 | 10/2013 | Khlat |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,633,766 B2 | 1/2014 | Khlat et al. |
| 8,638,165 B2 | 1/2014 | Shah et al. |
| 8,648,657 B1 | 2/2014 | Rozenblit |

(56) References Cited

U.S. PATENT DOCUMENTS

| | | | |
|---|---|---|---|
| 8,659,355 B2 | 2/2014 | Henshaw et al. | |
| 8,717,100 B2 | 5/2014 | Reisner et al. | |
| 8,718,579 B2 | 5/2014 | Drogi | |
| 8,718,582 B2 | 5/2014 | See et al. | |
| 8,725,218 B2 | 5/2014 | Brown et al. | |
| 8,744,382 B2 | 6/2014 | Hou et al. | |
| 8,749,307 B2 | 6/2014 | Zhu et al. | |
| 8,760,228 B2 | 6/2014 | Khlat | |
| 8,782,107 B2 | 7/2014 | Myara et al. | |
| 8,792,840 B2 | 7/2014 | Khlat et al. | |
| 8,803,605 B2 | 8/2014 | Fowers et al. | |
| 8,824,978 B2 | 9/2014 | Briffa et al. | |
| 8,829,993 B2 | 9/2014 | Briffa et al. | |
| 8,878,606 B2 | 11/2014 | Khlat et al. | |
| 8,884,696 B2 | 11/2014 | Langer | |
| 8,909,175 B1 | 12/2014 | McCallister | |
| 8,942,313 B2 | 1/2015 | Khlat et al. | |
| 8,942,652 B2 | 1/2015 | Khlat et al. | |
| 8,947,161 B2 | 2/2015 | Khlat et al. | |
| 8,947,162 B2 | 2/2015 | Wimpenny et al. | |
| 8,952,710 B2 | 2/2015 | Retz et al. | |
| 8,957,728 B2 | 2/2015 | Gorisse | |
| 8,975,959 B2 | 3/2015 | Khlat | |
| 8,981,839 B2 | 3/2015 | Kay et al. | |
| 8,981,847 B2 | 3/2015 | Balteanu | |
| 8,981,848 B2 | 3/2015 | Kay et al. | |
| 8,994,345 B2 | 3/2015 | Wilson | |
| 9,019,011 B2 | 4/2015 | Hietala et al. | |
| 9,020,451 B2 | 4/2015 | Khlat | |
| 9,024,688 B2 | 5/2015 | Kay et al. | |
| 9,041,364 B2 | 5/2015 | Khlat | |
| 9,041,365 B2 | 5/2015 | Kay et al. | |
| 2002/0071497 A1 | 6/2002 | Bengtsson et al. | |
| 2003/0031271 A1 | 2/2003 | Bozeki et al. | |
| 2003/0062950 A1 | 4/2003 | Hamada et al. | |
| 2003/0137286 A1 | 7/2003 | Kimball et al. | |
| 2003/0146791 A1 | 8/2003 | Shvarts et al. | |
| 2003/0153289 A1 | 8/2003 | Hughes et al. | |
| 2003/0198063 A1 | 10/2003 | Smyth | |
| 2003/0206603 A1 | 11/2003 | Husted | |
| 2003/0220953 A1 | 11/2003 | Allred | |
| 2003/0232622 A1 | 12/2003 | Seo et al. | |
| 2004/0047329 A1 | 3/2004 | Zheng | |
| 2004/0051384 A1 | 3/2004 | Jackson et al. | |
| 2004/0124913 A1 | 7/2004 | Midya et al. | |
| 2004/0127173 A1 | 7/2004 | Leizerovich | |
| 2004/0132424 A1 | 7/2004 | Aytur et al. | |
| 2004/0184569 A1 | 9/2004 | Challa et al. | |
| 2004/0196095 A1 | 10/2004 | Nonaka | |
| 2004/0219891 A1 | 11/2004 | Hadjichristos | |
| 2004/0239301 A1 | 12/2004 | Kobayashi | |
| 2004/0266366 A1 | 12/2004 | Robinson et al. | |
| 2004/0267842 A1 | 12/2004 | Allred | |
| 2005/0008093 A1 | 1/2005 | Matsuura et al. | |
| 2005/0032499 A1 | 2/2005 | Cho | |
| 2005/0047180 A1 | 3/2005 | Kim | |
| 2005/0064830 A1 | 3/2005 | Grigore | |
| 2005/0079835 A1 | 4/2005 | Takabayashi et al. | |
| 2005/0093630 A1 | 5/2005 | Whittaker et al. | |
| 2005/0110562 A1 | 5/2005 | Robinson et al. | |
| 2005/0122171 A1 | 6/2005 | Miki et al. | |
| 2005/0156582 A1 | 7/2005 | Redl et al. | |
| 2005/0156662 A1 | 7/2005 | Raghupathy et al. | |
| 2005/0157778 A1 | 7/2005 | Trachewsky et al. | |
| 2005/0200407 A1 | 9/2005 | Arai et al. | |
| 2005/0286616 A1 | 12/2005 | Kodavati | |
| 2006/0006946 A1 | 1/2006 | Burns et al. | |
| 2006/0062324 A1 | 3/2006 | Naito et al. | |
| 2006/0097711 A1 | 5/2006 | Brandt | |
| 2006/0128324 A1 | 6/2006 | Tan et al. | |
| 2006/0154637 A1 | 7/2006 | Eyries et al. | |
| 2006/0178119 A1 | 8/2006 | Jarvinen | |
| 2006/0181340 A1 | 8/2006 | Dhuyvetter | |
| 2006/0220627 A1 | 10/2006 | Koh | |
| 2006/0244513 A1 | 11/2006 | Yen et al. | |
| 2007/0008804 A1 | 1/2007 | Lu et al. | |
| 2007/0014382 A1 | 1/2007 | Shakeshaft et al. | |
| 2007/0024360 A1 | 2/2007 | Markowski | |
| 2007/0024365 A1 | 2/2007 | Ramaswamy et al. | |
| 2007/0063681 A1 | 3/2007 | Liu | |
| 2007/0082622 A1 | 4/2007 | Leinonen et al. | |
| 2007/0146076 A1 | 6/2007 | Baba | |
| 2007/0159256 A1 | 7/2007 | Ishikawa et al. | |
| 2007/0182392 A1 | 8/2007 | Nishida | |
| 2007/0183532 A1 | 8/2007 | Matero | |
| 2007/0184794 A1 | 8/2007 | Drogi et al. | |
| 2007/0249304 A1 | 10/2007 | Snelgrove et al. | |
| 2007/0259628 A1 | 11/2007 | Carmel et al. | |
| 2007/0290749 A1 | 12/2007 | Woo et al. | |
| 2008/0003950 A1 | 1/2008 | Haapoja et al. | |
| 2008/0044041 A1 | 2/2008 | Tucker et al. | |
| 2008/0081572 A1 | 4/2008 | Rofougaran | |
| 2008/0104432 A1 | 5/2008 | Vinayak et al. | |
| 2008/0150619 A1 | 6/2008 | Lesso et al. | |
| 2008/0205095 A1* | 8/2008 | Pinon et al. | 363/39 |
| 2008/0224769 A1 | 9/2008 | Markowski et al. | |
| 2008/0242246 A1 | 10/2008 | Minnis et al. | |
| 2008/0252278 A1 | 10/2008 | Lindeberg et al. | |
| 2008/0258831 A1 | 10/2008 | Kunihiro et al. | |
| 2008/0259656 A1 | 10/2008 | Grant | |
| 2008/0280577 A1 | 11/2008 | Beukema et al. | |
| 2009/0004981 A1 | 1/2009 | Eliezer et al. | |
| 2009/0045872 A1 | 2/2009 | Kenington | |
| 2009/0082006 A1 | 3/2009 | Pozsgay et al. | |
| 2009/0097591 A1 | 4/2009 | Kim | |
| 2009/0160548 A1 | 6/2009 | Ishikawa et al. | |
| 2009/0167260 A1 | 7/2009 | Pauritsch et al. | |
| 2009/0174466 A1 | 7/2009 | Hsieh et al. | |
| 2009/0184764 A1 | 7/2009 | Markowski et al. | |
| 2009/0190699 A1 | 7/2009 | Kazakevich et al. | |
| 2009/0191826 A1 | 7/2009 | Takinami et al. | |
| 2009/0218995 A1 | 9/2009 | Ahn | |
| 2009/0230934 A1 | 9/2009 | Hooijschuur et al. | |
| 2009/0261908 A1 | 10/2009 | Markowski | |
| 2009/0284235 A1 | 11/2009 | Weng et al. | |
| 2009/0289720 A1 | 11/2009 | Takinami et al. | |
| 2009/0319065 A1 | 12/2009 | Risbo | |
| 2010/0001793 A1 | 1/2010 | Van Zeijl et al. | |
| 2010/0002473 A1 | 1/2010 | Williams | |
| 2010/0019749 A1 | 1/2010 | Katsuya et al. | |
| 2010/0019840 A1 | 1/2010 | Takahashi | |
| 2010/0026250 A1 | 2/2010 | Petty | |
| 2010/0045247 A1 | 2/2010 | Blanken et al. | |
| 2010/0171553 A1 | 7/2010 | Okubo et al. | |
| 2010/0253309 A1 | 10/2010 | Xi et al. | |
| 2010/0266066 A1 | 10/2010 | Takahashi | |
| 2010/0289568 A1 | 11/2010 | Eschauzier et al. | |
| 2010/0301947 A1 | 12/2010 | Fujioka et al. | |
| 2010/0308654 A1 | 12/2010 | Chen | |
| 2010/0311365 A1 | 12/2010 | Vinayak et al. | |
| 2010/0321127 A1 | 12/2010 | Watanabe et al. | |
| 2010/0327825 A1 | 12/2010 | Mehas et al. | |
| 2010/0327971 A1 | 12/2010 | Kumagai | |
| 2011/0018626 A1 | 1/2011 | Kojima | |
| 2011/0058601 A1 | 3/2011 | Kim et al. | |
| 2011/0084760 A1 | 4/2011 | Guo et al. | |
| 2011/0109387 A1* | 5/2011 | Lee | 330/251 |
| 2011/0148375 A1 | 6/2011 | Tsuji | |
| 2011/0234182 A1 | 9/2011 | Wilson | |
| 2011/0235827 A1 | 9/2011 | Lesso et al. | |
| 2011/0260706 A1 | 10/2011 | Nishijima | |
| 2011/0279180 A1 | 11/2011 | Yamanouchi et al. | |
| 2011/0298433 A1 | 12/2011 | Tam | |
| 2011/0298539 A1 | 12/2011 | Drogi et al. | |
| 2012/0025907 A1 | 2/2012 | Koo et al. | |
| 2012/0025919 A1 | 2/2012 | Huynh | |
| 2012/0034893 A1 | 2/2012 | Baxter et al. | |
| 2012/0049894 A1 | 3/2012 | Berchtold et al. | |
| 2012/0049953 A1 | 3/2012 | Khlat | |
| 2012/0068767 A1 | 3/2012 | Henshaw et al. | |
| 2012/0074916 A1 | 3/2012 | Trochut | |
| 2012/0098595 A1 | 4/2012 | Stockert | |
| 2012/0119813 A1 | 5/2012 | Khlat et al. | |
| 2012/0133299 A1 | 5/2012 | Capodivacca et al. | |

(56) References Cited

U.S. PATENT DOCUMENTS

| | | |
|---|---|---|
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0170690 A1 | 7/2012 | Ngo et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0236444 A1 | 9/2012 | Srivastava et al. |
| 2012/0244916 A1 | 9/2012 | Brown et al. |
| 2012/0269240 A1 | 10/2012 | Balteanu et al. |
| 2012/0299647 A1 | 11/2012 | Honjo et al. |
| 2012/0313701 A1* | 12/2012 | Khlat et al. ............ 330/127 |
| 2013/0024142 A1 | 1/2013 | Folkmann et al. |
| 2013/0034139 A1 | 2/2013 | Khlat et al. |
| 2013/0094553 A1 | 4/2013 | Paek et al. |
| 2013/0106378 A1 | 5/2013 | Khlat |
| 2013/0107769 A1 | 5/2013 | Khlat et al. |
| 2013/0134956 A1 | 5/2013 | Khlat |
| 2013/0135043 A1 | 5/2013 | Hietala et al. |
| 2013/0141064 A1 | 6/2013 | Kay et al. |
| 2013/0141068 A1 | 6/2013 | Kay et al. |
| 2013/0141072 A1 | 6/2013 | Khlat et al. |
| 2013/0141169 A1 | 6/2013 | Khlat et al. |
| 2013/0147445 A1 | 6/2013 | Levesque et al. |
| 2013/0154729 A1 | 6/2013 | Folkmann et al. |
| 2013/0169245 A1 | 7/2013 | Kay et al. |
| 2013/0181521 A1 | 7/2013 | Khlat |
| 2013/0214858 A1 | 8/2013 | Tournatory et al. |
| 2013/0229235 A1 | 9/2013 | Ohnishi |
| 2013/0238913 A1 | 9/2013 | Huang et al. |
| 2013/0271221 A1 | 10/2013 | Levesque et al. |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |
| 2014/0028370 A1 | 1/2014 | Wimpenny |
| 2014/0028392 A1 | 1/2014 | Wimpenny |
| 2014/0049321 A1 | 2/2014 | Gebeyehu et al. |
| 2014/0055197 A1 | 2/2014 | Khlat et al. |
| 2014/0057684 A1 | 2/2014 | Khlat |
| 2014/0062590 A1 | 3/2014 | Khlat et al. |
| 2014/0097895 A1 | 4/2014 | Khlat et al. |
| 2014/0099906 A1 | 4/2014 | Khlat |
| 2014/0099907 A1 | 4/2014 | Chiron |
| 2014/0103995 A1 | 4/2014 | Langer |
| 2014/0111178 A1 | 4/2014 | Khlat et al. |
| 2014/0125408 A1 | 5/2014 | Kay et al. |
| 2014/0139199 A1 | 5/2014 | Khlat et al. |
| 2014/0184335 A1 | 7/2014 | Nobbe et al. |
| 2014/0203868 A1 | 7/2014 | Khlat et al. |
| 2014/0203869 A1 | 7/2014 | Khlat et al. |
| 2014/0225674 A1 | 8/2014 | Folkmann et al. |
| 2014/0266427 A1 | 9/2014 | Chiron |
| 2014/0266428 A1 | 9/2014 | Chiron et al. |
| 2014/0306769 A1 | 10/2014 | Khlat et al. |
| 2015/0048891 A1 | 2/2015 | Rozek et al. |

FOREIGN PATENT DOCUMENTS

| | | |
|---|---|---|
| CN | 1898860 A | 1/2007 |
| CN | 101106357 A | 1/2008 |
| CN | 101201891 A | 6/2008 |
| CN | 101379695 A | 3/2009 |
| CN | 101405671 A | 4/2009 |
| CN | 101416385 A | 4/2009 |
| CN | 101427459 A | 5/2009 |
| CN | 101548476 A | 9/2009 |
| CN | 101626355 A | 1/2010 |
| CN | 101635697 A | 1/2010 |
| CN | 101669280 A | 3/2010 |
| CN | 101867284 A | 10/2010 |
| CN | 201674399 U | 12/2010 |
| EP | 0755121 A2 | 1/1997 |
| EP | 1047188 A2 | 10/2000 |
| EP | 1317105 A1 | 6/2003 |
| EP | 1492227 A1 | 12/2004 |
| EP | 1557955 A1 | 7/2005 |
| EP | 1569330 A1 | 8/2005 |
| EP | 2214304 A1 | 8/2010 |
| EP | 2244366 A1 | 10/2010 |
| EP | 2372904 A1 | 10/2011 |
| EP | 2579456 A1 | 4/2013 |
| GB | 2398648 A | 8/2004 |
| GB | 2462204 A | 2/2010 |
| GB | 2465552 A | 5/2010 |
| GB | 2484475 A | 4/2012 |
| TW | 461168 B | 10/2001 |
| WO | 0048306 A1 | 8/2000 |
| WO | 04002006 A1 | 12/2003 |
| WO | 2004082135 A2 | 9/2004 |
| WO | 2005013084 A2 | 2/2005 |
| WO | 2006021774 A1 | 3/2006 |
| WO | 2006070319 A1 | 7/2006 |
| WO | 2006073208 A1 | 7/2006 |
| WO | 2007107919 A1 | 9/2007 |
| WO | 2007149346 A2 | 12/2007 |
| WO | 2012151594 A2 | 11/2012 |
| WO | 2012172544 A1 | 12/2012 |

OTHER PUBLICATIONS

Cidronali, A. et al., "A 240W Dual-Band 870 and 2140 MHz Envelope Tracking GaN PA Designed by a Probability Distribution Conscious Approach," IEEE MTT-S International Microwave Symposium Digest, Jun. 5-10, 2011, 4 pages.

Dixon, N., "Standardisation Boosts Momentum for Envelope Tracking," Microwave Engineering, Europe, Apr. 20, 2011, 2 pages, http://www.mwee.com/en/standardisation-boosts-momentum-for-envelope-tracking.html?cmp_ids=71&news_ids=222901746.

Hekkala, A. et al., "Adaptive Time Misalignment Compensation in Envelope Tracking Amplifiers," 2008 IEEE International Symposium on Spread Spectrum Techniques and Applications, Aug. 2008, pp. 761-765.

Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.

Kim, N. et al, "Ripple Feedback Filter Suitable for Analog/Digital Mixed-Mode Audio Amplifier for Improved Efficiency and Stability," 2002 IEEE Power Electronics Specialists Conference, vol. 1, Jun. 23, 2002, pp. 45-49.

Knutson, P, et al., "An Optimal Approach To Digital Raster Mapper Design," 1991 IEEE International Conference on Consumer Electronics held Jun. 5-7, 1991, vol. 37, Issue 4, published Nov. 1991, pp. 746-752.

Le, Hanh-Phuc et al., "A 32nm Fully Integrated Reconfigurable Switched-Capacitor DC-DC Convertor Delivering 0.55W/mm2 at 81% Efficiency," 2010 IEEE International Solid State Circuits Conference, Feb. 7-11, 2010, pp. 210-212.

Li, Y. et al., "A Highly Efficient SiGe Differential Power Amplifier Using an Envelope-Tracking Technique for 3GPP LTE Applications," 2010 IEEE Bipolar/BiCMOS Circuits and Technology Meeting (BCTM), Oct. 4-6, 2010, pp. 121-124.

Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.

Unknown, "Nujira Files 100th Envelope Tracking Patent," CS: Compound Semiconductor, Apr. 11, 2011, 1 page, http://www.compoundsemiconductor.net/csc/news-details.php?cat=news&id=19733338&key=Nujira%20Files%20100th%20Envelope%20Tracking%20Patent&type=n.

Non-final Office Action for U.S. Appl. No. 11/113,873, now U.S. Pat. No. 7,773,691, mailed Feb. 1, 2008, 17 pages.

Final Office Action for U.S. Appl. No. 11/113,873, now U.S. Pat. No. 7,773,691, mailed Jul. 30, 2008, 19 pages.

Non-final Office Action for U.S. Appl. No. 11/113,873, now U.S. Pat. No. 7,773,691, mailed Nov. 26, 2008, 22 pages.

(56) References Cited

OTHER PUBLICATIONS

Final Office Action for U.S. Appl. No. 11/113,873, now U.S. Pat. No. 7,773,691, mailed May 4, 2009, 20 pages.
Non-final Office Action for U.S. Appl. No. 11/113,873, now U.S. Pat. No. 7,773,691, mailed Feb. 3, 2010, 21 pages.
Notice of Allowance for U.S. Appl. No. 11/113,873, now U.S. Pat. No. 7,773,691, mailed Jun. 9, 2010, 7 pages.
International Search Report for PCT/US06/12619 mailed May 8, 2007, 2 pages.
Extended European Search Report for application 06740532.4 mailed Dec. 7, 2010, 7 pages.
Non-final Office Action for U.S. Appl. No. 12/112,006 mailed Apr. 5, 2010, 6 pages.
Notice of Allowance for U.S. Appl. No. 12/112,006 mailed Jul. 19, 2010, 6 pages.
Non-final Office Action for U.S. Appl. No. 13/089,917 mailed Nov. 23, 2012, 6 pages.
International Search Report for PCT/US11/033037, mailed Aug. 9, 2011, 10 pages.
International Preliminary Report on Patentability for PCT/US2011/033037 mailed Nov. 1, 2012, 7 pages.
Non-Final Office Action for U.S. Appl. No. 13/188,024, mailed Feb. 5, 2013, 8 pages.
International Search Report for PCT/US2011/044857, mailed Oct. 24, 2011, 10 pages.
International Preliminary Report on Patentability for PCT/US2011/044857 mailed Mar. 7, 2013, 6 pages.
Non-final Office Action for U.S. Appl. No. 13/218,400 mailed Nov. 8, 2012, 7 pages.
Notice of Allowance for U.S. Appl. No. 13/218,400 mailed Apr. 11, 2013, 7 pages.
International Search Report for PCT/US11/49243, mailed Dec. 22, 2011, 9 pages.
International Preliminary Report on Patentability for PCT/US11/49243 mailed Nov. 13, 2012, 33 pages.
International Search Report for PCT/US2011/054106 mailed Feb. 9, 2012, 11 pages.
International Search Report for PCT/US2011/061007 mailed Aug. 16, 2012, 16 pages.
Non-Final Office Action for U.S. Appl. No. 13/297,470 mailed May 8, 2013, 15 pages.
International Search Report for PCT/US2011/061009 mailed Feb. 8, 2012, 14 pages.
International Search Report for PCT/US2012/023495 mailed May 7, 2012, 13 pages.
Non-final Office Action for U.S. Appl. No. 13/222,453 mailed Dec. 6, 2012, 13 pages.
Notice of Allowance for U.S. Appl. No. 13/222,453 mailed Feb. 21, 2013, 7 pages.
Invitation to Pay Additional Fees and Where Applicable Protest Fee for PCT/US2012/024124 mailed Jun. 1, 2012, 7 pages.
International Search Report for PCT/US2012/024124 mailed Aug. 24, 2012, 14 pages.
Notice of Allowance for U.S. Appl. No. 13/316,229 mailed Nov. 14, 2012, 9 pages.
International Search Report for PCT/US2011/064255 mailed Apr. 3, 2012, 12 pages.
International Search Report for PCT/US2012/40317 mailed Sep. 7, 2012, 7 pages.
International Search Report for PCT/US2012/046887 mailed Dec. 21, 2012, 12 pages.
Non-final Office Action for U.S. Appl. No. 13/222,484 mailed Nov. 8, 2012, 9 pages.
Final Office Action for U.S. Appl. No. 13/222,484 mailed Apr. 10, 2013, 10 pages.
International Search Report and Written Opinion for PCT/US2012/053654 mailed Feb. 15, 2013, 11 pages.
International Search Report and Written Opinion for PCT/US2012/062070, mailed Jan. 21, 2013, 12 pages.
International Search Report and Written Opinion for PCT/US2012/067230 mailed Feb. 21, 2013, 10 pages.
Invitation to Pay Additional Fees for PCT/US2011/061007, mailed Feb. 13, 2012, 7 pages.
Notice of Allowance for U.S. Appl. No. 13/188,024, mailed Jun. 18, 2013, 7 pages.
International Preliminary Report on Patentability for PCT/US2011/054106 mailed Apr. 11, 2013, 8 pages.
International Preliminary Report on Patentability for PCT/US2011/061007 mailed May 30, 2013, 11 pages.
International Preliminary Report on Patentability for PCT/US2011/061009 mailed May 30, 2013, 10 pages.
Non-Final Office Action for U.S. Appl. No. 13/423,649, mailed May 22, 2013, 7 pages.
Advisory Action for U.S. Appl. No. 13/222,484, mailed Jun. 14, 2013, 3 pages.
International Preliminary Report on Patentability for PCT/US2011/064255, mailed Jun. 20, 2013, 7 pages.
Notice of Allowance for U.S. Appl. No. 13/343,840, mailed Jul. 1, 2013, 8 pages.
Notice of Allowance for U.S. Appl. No. 13/363,888, mailed Jul. 18, 2013, 9 pages.
Notice of Allowance for U.S. Appl. No. 13/222,453, mailed Aug. 22, 2013, 8 pages.
International Preliminary Report on Patentability for PCT/US2012/024124, mailed Aug. 22, 2013, 8 pages.
Notice of Allowance for U.S. Appl. No. 13/550,060, mailed Aug. 16, 2013, 8 pages.
Notice of Allowance for U.S. Appl. No. 13/222,484, mailed Aug. 26, 2013, 8 pages.
International Preliminary Report on Patentability for PCT/US2012/023495, mailed Aug. 15, 2013, 10 pages.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Non-Final Office Action for U.S. Appl. No. 13/367,973, mailed Sep. 24, 2013, 8 pages.
Notice of Allowance for U.S. Appl. No. 13/423,649, mailed Aug. 30, 2013, 8 pages.
Notice of Allowance for U.S. Appl. No. 13/316,229, mailed Aug. 29, 2013, 8 pages.
Notice of Allowance for U.S. Appl. No. 13/602,856, mailed Sep. 24, 2013, 9 pages.
Quayle Action for U.S. Appl. No. 13/531,719, mailed Oct. 10, 2013, 5 pages.
Non-Final Office Action for U.S. Appl. No. 12/836,307, mailed Nov. 5, 2013, 6 pages.
Final Office Action for U.S. Appl. No. 13/297,470, mailed Oct. 25, 2013, 17 pages.
Notice of Allowance for U.S. Appl. No. 14/022,858, mailed Oct. 25, 2013, 9 pages.
Non-Final Office Action for U.S. Appl. No. 13/550,049, mailed Nov. 25, 2013, 6 pages.
Examination Report for European Patent Application No. 11720630, mailed Aug. 16, 2013, 5 pages.
Notice of Allowance for U.S. Appl. No. 14/072,140, mailed Dec. 2, 2014, 8 pages.
First Office Action for Chinese Patent Application No. 201280026559.0, issued Nov. 3, 2014, 14 pages (with English translation).
Notice of Allowance for U.S. Appl. No. 13/486,012, mailed Nov. 21, 2014, 8 pages.
Final Office Action for U.S. Appl. No. 13/689,883, mailed Jan. 2, 2015, 13 pages.
Notice of Allowance for U.S. Appl. No. 13/690,187, mailed Dec. 19, 2014, 8 pages.
Notice of Allowance for U.S. Appl. No. 13/747,694, mailed Dec. 22, 2014, 9 pages.

(56) References Cited

OTHER PUBLICATIONS

Notice of Allowance for U.S. Appl. No. 13/951,976, mailed Dec. 26, 2014, 9 pages.
Non-Final Office Action for U.S. Appl. No. 13/747,749, mailed Nov. 12, 2014, 32 pages.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.
International Preliminary Report on Patentability for PCT/US2012/040317, mailed Dec. 12, 2013, 5 pages.
Notice of Allowance for U.S. Appl. No. 13/531,719, mailed Dec. 30, 2013, 7 pages.
Non-Final Office Action for U.S. Appl. No. 14/022,940, mailed Dec. 20, 2013, 5 pages.
International Search Report and Written Opinion for PCT/US2013/052277, mailed Jan. 7, 2014, 14 pages.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 1, 2012, pp. 1185-1198.
Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.
Notice of Allowance for U.S. Appl. No. 12/836,307 mailed May 5, 2014, 6 pages.
Examination Report for European Patent Application No. 11720630.0 issued Mar. 18, 2014, 4 pages.
Notice of Allowance for U.S. Appl. No. 13/297,490, mailed Feb. 27, 2014, 7 pages.
Non-Final Office Action for U.S. Appl. No. 13/297,470, mailed Feb. 20, 2014, 16 pages.
Notice of Allowance for U.S. Appl. No. 14/022,858 mailed May 27, 2014, 6 pages.
Non-Final Office Action for U.S. Appl. No. 13/367,973 mailed Apr. 25, 2014, 5 pages.
Non-Final Office Action for U.S. Appl. No. 13/486,012, mailed Jul. 28, 2014, 7 pages.
Notice of Allowance for U.S. Appl. No. 13/550,049, mailed Mar. 6, 2014, 5 pages.
International Preliminary Report on Patentability for PCT/US2012/046887, mailed Jan. 30, 2014, 8 pages.
International Preliminary Report on Patentability for PCT/US2012/053654, mailed Mar. 13, 2014, 7 pages.
Non-Final Office Action for U.S. Appl. No. 13/647,815 mailed May 2, 2014, 6 pages.
Non-Final Office Action for U.S. Appl. No. 13/689,883 mailed Mar. 27, 2014, 13 pages.
International Preliminary Report on Patentability for PCT/US2012/062070 mailed May 8, 2014, 8 pages.
Non-Final Office Action for U.S. Appl. No. 13/661,552, mailed Feb. 21, 2014, 5 pages.
Notice of Allowance for U.S. Appl. No. 13/661,552, mailed Jun. 13, 2014, 5 pages.
International Search Report and Written Opinion for PCT/US2012/062110 issued Apr. 8, 2014, 12 pages.
International Preliminary Report on Patentability for PCT/US2012/062110 mailed May 8, 2014, 9 pages.
Non-Final Office Action for U.S. Appl. No. 13/692,084 mailed Apr. 10, 2014, 6 pages.
Notice of Allowance for U.S. Appl. No. 13/692,084, mailed Jul. 23, 2014, 7 pages.
International Preliminary Report on Patentability and Written Opinion for PCT/US2012/067230, mailed Jun. 12, 2014, 7 pages.
Non-Final Office Action for U.S. Appl. No. 13/684,826 mailed Apr. 3, 2014, 5 pages.
Notice of Allowance for U.S. Appl. No. 13/684,826, mailed Jul. 18, 2014, 7 pages.
Notice of Allowance for U.S. Appl. No. 14/022,940, mailed Jun. 10, 2014, 7 pages.
Non-Final Office Action for U.S. Appl. No. 13/714,600, mailed May 9, 2014, 14 pages.
Non-Final Office Action for U.S. Appl. No. 13/951,976 mailed Apr. 4, 2014, 7 pages.
International Search Report and Written Opinion for PCT/US2013/065403, mailed Feb. 5, 2014, 11 pages.
International Search Report and Written Opinion for PCT/US2014/028089, mailed Jul. 17, 2014, 10 pages.
Notice of Allowance for U.S. Appl. No. 13/948,291, mailed Feb. 11, 2015, 7 pages.
First Office Action for Chinese Patent Application No. 201180030273.5, issued Dec. 3, 2014, 15 pages (with English translation).
Notice of Allowance for U.S. Appl. No. 14/022,858, mailed Feb. 17, 2015, 7 pages.
Notice of Allowance for U.S. Appl. No. 14/072,225, mailed Jan. 22, 2015, 7 pages.
Final Office Action for U.S. Appl. No. 13/661,227, mailed Feb. 6, 2015, 24 pages.
International Preliminary Report on Patentability for PCT/US2013/052277, mailed Feb. 5, 2015, 9 pages.
Non-Final Office Action for U.S. Appl. No. 14/048,109, mailed Feb. 18, 2015, 8 pages.
Notice of Allowance for U.S. Appl. No. 13/747,725, mailed Feb. 2, 2015, 10 pages.
Non-Final Office Action for U.S. Appl. No. 12/836,307, mailed Sep. 25, 2014, 5 pages.
Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
Notice of Allowance for U.S. Appl. No. 13/367,973, mailed Sep. 15, 2014, 7 pages.
Extended European Search Report for European Patent Application No. 12794149.0, issued Oct. 29, 2014, 6 pages.
Notice of Allowance for U.S. Appl. No. 13/647,815, mailed Sep. 19, 2014, 6 pages.
Non-Final Office Action for U.S. Appl. No. 13/661,227, mailed Sep. 29, 2014, 24 pages.
Notice of Allowance for U.S. Appl. No. 13/684,826, mailed Sep. 8, 2014, 6 pages.
Non-Final Office Action for U.S. Appl. No. 13/714,600, mailed Oct. 15, 2014, 13 pages.
Notice of Allowance for U.S. Appl. No. 13/914,888, mailed Oct. 17, 2014, 10 pages.
Non-Final Office Action for U.S. Appl. No. 13/747,725, mailed Oct. 7, 2014, 6 pages.
International Search Report and Written Opinion for PCT/US2014/012927, mailed Sep. 30, 2014, 11 pages.
International Search Report and Written Opinion for PCT/US2014/028178, mailed Sep. 30, 2014, 17 pages.
European Search Report for Patent Application No. 14162682.0, issued Aug. 27, 2014, 7 pages.
Notice of Allowance for U.S. Appl. No. 14/072,140, mailed Aug. 27, 2014, 8 pages.
Non-Final Office Action for U.S. Appl. No. 14/072,225, mailed Aug. 15, 2014, 4 pages.
Notice of Allowance for U.S. Appl. No. 13/548,283, mailed Sep. 3, 2014, 7 pages.
Non-Final Office Action for U.S. Appl. No. 13/689,883, mailed Aug. 27, 2014, 12 pages.
Notice of Allowance for U.S. Appl. No. 13/690,187, mailed Sep. 3, 2014, 9 pages.
Non-Final Office Action for U.S. Appl. No. 13/782,142, mailed Sep. 4, 2014, 6 pages.
Invitation to Pay Additional Fees and Partial International Search Report for PCT/US2014/028178, mailed Jul. 24, 2014, 7 pages.
Notice of Allowance for U.S. Appl. No. 12/836,307, mailed Mar. 2, 2015, 6 pages.

(56) References Cited

OTHER PUBLICATIONS

Notice of Allowance for U.S. Appl. No. 13/297,470, mailed Feb. 25, 2015, 15 pages.
Corrected Notice of Allowance for U.S. Appl. No. 13/297,470, mailed Apr. 6, 2015, 11 pages.
European Search Report for European Patent Application No. 14190851.7, issued Mar. 5, 2015, 6 pages.
Non-Final Office Action for U.S. Appl. No. 14/122,852, mailed Feb. 27, 2015, 5 pages.
Final Office Action for U.S. Appl. No. 13/714,600, mailed Mar. 10, 2015, 14 pages.
Non-Final Office Action for U.S. Appl. No. 14/056,292, mailed Mar. 6, 2015, 8 pages.
Final Office Action for U.S. Appl. No. 13/747,749, mailed Mar. 20, 2015, 35 pages.
Non-Final Office Action for U.S. Appl. No. 14/072,120, mailed Apr. 14, 2015, 8 pages.
European Examination Report for European Patent Application No. 14162682.0, mailed May 22, 2015, 5 pages.
Corrected Notice of Allowance for U.S. Appl. No. 13/297,470, mailed Jun. 5, 2015, 11 pages.
Advisory Action for U.S. Appl. No. 13/689,883, mailed Apr. 20, 2015, 3 pages.
Advisory Action for U.S. Appl. No. 13/661,227, mailed May 12, 2015, 3 pages.
Advisory Action for U.S. Appl. No. 13/714,600, mailed May 26, 2015, 3 pages.
Notice of Allowance for U.S. Appl. No. 13/747,725, mailed May 13, 2015, 9 pages.
Notice of Allowance for U.S. Appl. No. 13/747,749, mailed Jun. 4, 2015, 8 pages.
Non-Final Office Action for U.S. Appl. No. 13/552,768, mailed Apr. 20, 2015, 12 pages.
Non-Final Office Action for U.S. Appl. No. 13/689,922, mailed Apr. 20, 2015, 19 pages.
Non-Final Office Action for U.S. Appl. No. 13/727,911, mailed Apr. 20, 2015, 10 pages.
Non-Final Office Action for U.S. Appl. No. 14/163,229, mailed Apr. 23, 2015, 9 pages.
Non-Final Office Action for U.S. Appl. No. 14/163,256, mailed Apr. 23, 2015, 9 pages.
Notice of Allowance for U.S. Appl. No. 14/176,611, mailed Apr. 27, 2015, 7 pages.
International Preliminary Report on Patentability for PCT/US2013/065403, mailed Apr. 30, 2015, 8 pages.
Quayle Action for U.S. Appl. No. 13/689,940, mailed May 14, 2015, 7 pages.
Notice of Allowance for U.S. Appl. No. 13/661,164, mailed Jun. 3, 2015, 6 pages.
Non-Final Office Action for U.S. Appl. No. 14/082,629, mailed Jun. 18, 2015, 15 pages.
First Office Action for Chinese Patent Application No. 201280052694.2, issued Mar. 24, 2015, 35 pages.
First Office Action and Search Report for Chinese Patent Application No. 201280007941.7, issued May 13, 2015, 13 pages.
Yun, Hu et al., "Study of envelope tracking power amplifier design," Journal of Circuits and Systems, vol. 15, No. 6, Dec. 2010, pp. 6-10.
Notice of Allowance for U.S. Appl. No. 13/948,291, mailed Jul. 17, 2015, 8 pages.
Non-Final Office Action for U.S. Appl. No. 13/689,883, mailed Jul. 24, 2015, 13 pages.
Non-Final Office Action for U.S. Appl. No. 13/661,227, mailed Jul. 27, 2015, 25 pages.
Non-Final Office Action for U.S. Appl. No. 13/714,600, mailed Jul. 17, 2015, 14 pages.
Notice of Allowance for U.S. Appl. No. 14/212,154, mailed Jul. 17, 2015, 8 pages.
Notice of Allowance for U.S. Appl. No. 14/212,199, mailed Jul. 20, 2015, 8 pages.
Notice of Allowance for U.S. Appl. No. 14/072,120, mailed Jul. 30, 2015, 7 pages.
Notice of Allowance for U.S. Appl. No. 13/689,940, mailed Aug. 3, 2015, 6 pages.
International Preliminary Report on Patentability for PCT/US2014/012927, mailed Aug. 6, 2015, 9 pages.
First Office Action and Search Report for Chinese Patent Application No. 201210596632.X, mailed Jun. 25, 2015, 16 pages.
Notice of Allowance for U.S. Appl. No. 14/072,140, mailed Aug. 20, 2015, 6 pages.
Non-Final Office Action for U.S. Appl. No. 14/072,225, mailed Aug. 18, 2015, 4 pages.
Notice of Allowance for U.S. Appl. No. 13/747,725, mailed Sep. 1, 2015, 9 pages.
Notice of Allowance for U.S. Appl. No. 13/747,749, mailed Oct. 2, 2015, 8 pages.
Notice of Allowance for U.S. Appl. No. 13/552,768, mailed Sep. 22, 2015, 9 pages.
Final Office Action for U.S. Appl. No. 13/689,922, mailed Oct. 6, 2015, 20 pages.
Notice of Allowance for U.S. Appl. No. 13/727,911, mailed Sep. 14, 2015, 8 pages.
Notice of Allowance for U.S. Appl. No. 13/689,940, mailed Sep. 16, 2015, 7 pages.
Non-Final Office Action for U.S. Appl. No. 14/101,770, mailed Sep. 21, 2015, 5 pages.
Non-Final Office Action for U.S. Appl. No. 14/702,192, mailed Oct. 7, 2015, 7 pages.
Notice of Allowance for U.S. Appl. No. 13/661,164, mailed Oct. 21, 2015, 7 pages.
Non-Final Office Action for U.S. Appl. No. 14/254,215, mailed Oct. 15, 2015, 5 pages.
Notice of Allowance for U.S. Appl. No. 13/747,725, mailed Oct. 28, 2015, 9 pages.
Final Office Action for U.S. Appl. No. 14/163,256, mailed Nov. 2, 2015, 10 pages.
Final Office Action for U.S. Appl. No. 14/082,629, mailed Nov. 4, 2015, 17 pages.
Notice of Allowance for U.S. Appl. No. 14/163,229, mailed Nov. 5, 2015, 8 pages.
Second Office Action for Chinese Patent Application No. 201180030273.5, issued Aug. 14, 2015, 8 pages.
International Preliminary Report on Patentability for PCT/US2014/028089, mailed Sep. 24, 2015, 8 pages.
International Preliminary Report on Patentability for PCT/US2014/028178, mailed Sep. 24, 2015, 11 pages.
First Office Action for Chinese Patent Application No. 201180067293.X, mailed Aug. 6, 2015, 13 pages.

\* cited by examiner

OPEN LOOP RIPPLE CANCELLATION CIRCUIT IN A DC-DC CONVERTER

RELATED APPLICATIONS

This application claims the benefit of U.S. provisional patent application No. 61/701,114, filed Sep. 14, 2012, the disclosure of which is incorporated herein by reference in its entirety.

FIELD OF THE DISCLOSURE

The present disclosure relates to direct current (DC)-DC converters and radio frequency (RF) circuitry.

BACKGROUND

Switching power supplies often utilize inductive elements as energy storage elements to translate input power supply voltages to output power supply voltages, which are different from the input power supply voltages. As such, an inductive element in a switching power supply typically operates with a current increasing phase and a current decreasing phase, thereby resulting in an inductor current that is not constant. As a result, the inductor current may have a constant DC current and a varying AC current, which is commonly called a ripple current. The DC current is desirable and is required to provide power to a load from the switching power supply. The ripple current is typically undesirable and may be problematic for the load. Thus, there is a need for a switching power supply that minimizes the ripple current, mitigates effects of the ripple current, or both.

SUMMARY

A direct current DC-DC converter, which includes an open loop ripple cancellation circuit, a switching supply, and a parallel amplifier, is disclosed. During a calibration mode, the parallel amplifier provides a parallel amplifier output current to regulate a power supply output voltage based on a calibration setpoint. The switching supply drives the parallel amplifier output current toward zero using a switching control signal, such that during the calibration mode, an estimate of a current gain is based on the switching control signal. Further, during the calibration mode, the open loop ripple cancellation circuit is disabled. During a normal operation mode, the open loop ripple cancellation circuit provides a ripple cancellation current, which is based on the estimate of the current gain.

In one embodiment of the DC-DC converter, the DC-DC converter operates in either the calibration mode or the normal operation mode. During both the calibration mode and the normal operation mode, the switching supply provides a DC current and a ripple current to at least partially provide a power supply output signal. During both the calibration mode and the normal operation mode, the parallel amplifier provides the parallel amplifier output current to at least partially provide the power supply output signal. Since the ripple current is typically undesirable, during the normal operation mode, the open loop ripple cancellation circuit provides a ripple cancellation current to at least partially cancel the ripple current. During the calibration mode, the open loop ripple cancellation circuit is disabled.

In one embodiment of the DC-DC converter, to maximize cancellation of the ripple current, the ripple cancellation current must be about equal and inverted to the ripple current. However, the switching supply includes an inductive element, such that the ripple current is based on an inductance of the inductive element. Further, due to initial manufacturing tolerances, temperature drift, and the like, the inductance may change during operation, and the inductance may vary from unit to unit. Therefore, to maximize cancellation of the ripple current, the estimate of the current gain is updated to compensate for inductance changes, other changes, or both.

In one embodiment of the DC-DC converter, during the calibration mode, a calibration circuit is coupled to the switching supply and to power supply control circuitry. During the calibration mode, the calibration circuit mimics behavior of the switching supply to determine the estimate of the current gain. In one embodiment of the DC-DC converter, the DC-DC converter includes the calibration circuit.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1:
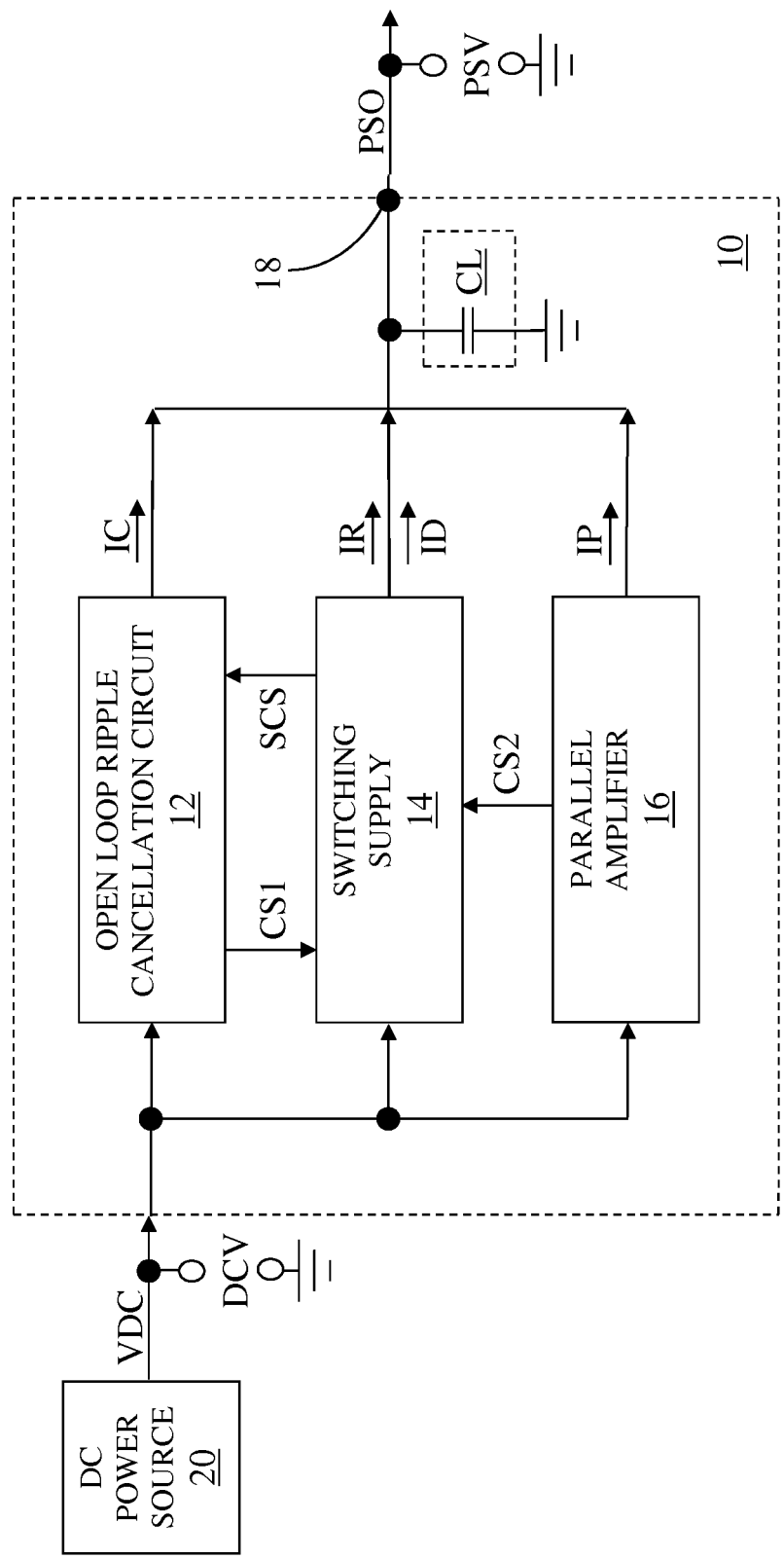
FIG. 1 shows a DC-DC converter according to one embodiment of the present disclosure.

FIG. 1 shows a DC-DC converter 10 according to one embodiment of the present disclosure. The DC-DC converter 10 includes an open loop ripple cancellation circuit 12, a switching supply 14, a parallel amplifier 16, and a load capacitive element CL. Further, the DC-DC converter 10 has an output connection node 18. A DC power source 20 provides a DC source signal VDC to the DC-DC converter 10. The DC source signal VDC has a DC source voltage DCV. In one embodiment of the DC power source 20, the DC power source 20 is a battery. The DC-DC converter 10 provides a power supply output signal PSO via the output connection node 18. The power supply output signal PSO has a power supply output voltage PSV. In one embodiment of the DC-DC converter 10, the power supply output signal PSO is based on the DC source signal VDC. As such, the power supply output voltage PSV is based on the DC source signal VDC.

The open loop ripple cancellation circuit 12 is coupled to the output connection node 18. The switching supply 14 is coupled to the output connection node 18. The parallel amplifier 16 is coupled to the output connection node 18. The load capacitive element CL is coupled between the output connection node 18 and a ground. In one embodiment of the DC-DC converter 10, the open loop ripple cancellation circuit 12 is coupled between the DC power source 20 and the output connection node 18. In one embodiment of the DC-DC converter 10, the switching supply 14 is coupled between the DC power source 20 and the output connection node 18. In one embodiment of the DC-DC converter 10, the parallel amplifier 16 is coupled between the DC power source 20 and the output connection node 18.

In one embodiment of the DC-DC converter 10, the DC-DC converter 10 operates in either a calibration mode or a normal operation mode. During the normal operation mode, the open loop ripple cancellation circuit 12 provides a ripple cancellation current IC. During both the calibration mode and the normal operation mode, the switching supply 14 provides a DC current ID and a ripple current IR. During both the calibration mode and the normal operation mode, the parallel amplifier 16 provides a parallel amplifier output current IP.

In one embodiment of the DC-DC converter 10, the switching supply 14 provides a switching control signal SCS to the open loop ripple cancellation circuit 12. Further, the switching supply 14 uses the switching control signal SCS to control internal switching of the switching supply 14. The open loop ripple cancellation circuit 12 provides a first current sense signal CS1 to the switching supply 14. The parallel amplifier 16 provides a second current sense signal CS2 to the switching supply 14. The first current sense signal CS1 is representative of the ripple cancellation current IC and the second current sense signal CS2 is representative of the parallel amplifier output current IP.

During the normal operation mode, the parallel amplifier 16 provides the parallel amplifier output current IP to regulate the power supply output voltage PSV based on a normal operation setpoint. During the calibration mode, the parallel amplifier 16 provides the parallel amplifier output current IP to regulate the power supply output voltage PSV based on a calibration setpoint. In this regard, during both the calibration mode and the normal operation mode, the parallel amplifier 16 at least partially provides the power supply output signal PSO. In one embodiment of the DC-DC converter 10, the calibration setpoint is equal to about one-half of a magnitude of the DC source voltage DCV.

In one embodiment of the DC-DC converter 10, during both the calibration mode and the normal operation mode, the switching supply 14 drives the parallel amplifier output current IP toward zero using the switching control signal SCS. In this regard, during both the calibration mode and the normal operation mode, the switching supply 14 at least partially provides the power supply output signal PSO. During the calibration mode, an estimate of a current gain is based on the switching control signal SCS. In one embodiment of the DC-DC converter 10, the estimate of the current gain ECG is based on a frequency of the switching control signal SCS. In one embodiment of the DC-DC converter 10, the switching supply 14 operates more efficiently than the parallel amplifier 16. Therefore, by driving the parallel amplifier output current IP toward zero, efficiency of the DC-DC converter 10 may be increased. Further, the parallel amplifier 16 may provide the power supply output voltage PSV more accurately than the switching supply 14. In this regard, the parallel amplifier 16 behaves like a voltage source and the switching supply 14 behaves like a current source.

In one embodiment of the switching supply 14, the switching supply 14 drives the parallel amplifier output current IP toward zero based on both the first current sense signal CS1 and the second current sense signal CS2. In an alternate embodiment of the switching supply 14, the switching supply 14 drives the parallel amplifier output current IP toward zero based on only the second current sense signal CS2.

In one embodiment of the DC-DC converter 10, during the calibration mode, the open loop ripple cancellation circuit 12 is disabled. During the normal operation mode, the open loop ripple cancellation circuit 12 operates using an operating current gain to at least partially cancel the ripple current IR, which is produced by the switching supply 14. The operating current gain is based on the estimate of the current gain. In one embodiment of the open loop ripple cancellation circuit 12, during the normal operation mode, the ripple cancellation current IC at least partially cancels the ripple current IR.

In one embodiment of the DC-DC converter 10, the DC power source 20 provides power to the open loop ripple cancellation circuit 12 via the DC source signal VDC, such that the ripple cancellation current IC is further based on the DC source signal VDC. In one embodiment of the DC-DC converter 10, the DC power source 20 provides power to the switching supply 14 via the DC source signal VDC, such that the DC current ID and the ripple current IR are further based on the DC source signal VDC. In one embodiment of the DC-DC converter 10, the DC power source 20 provides power to the parallel amplifier 16 via the DC source signal VDC, such that the parallel amplifier output current IP is further based on the DC source signal VDC.

Figure 2:
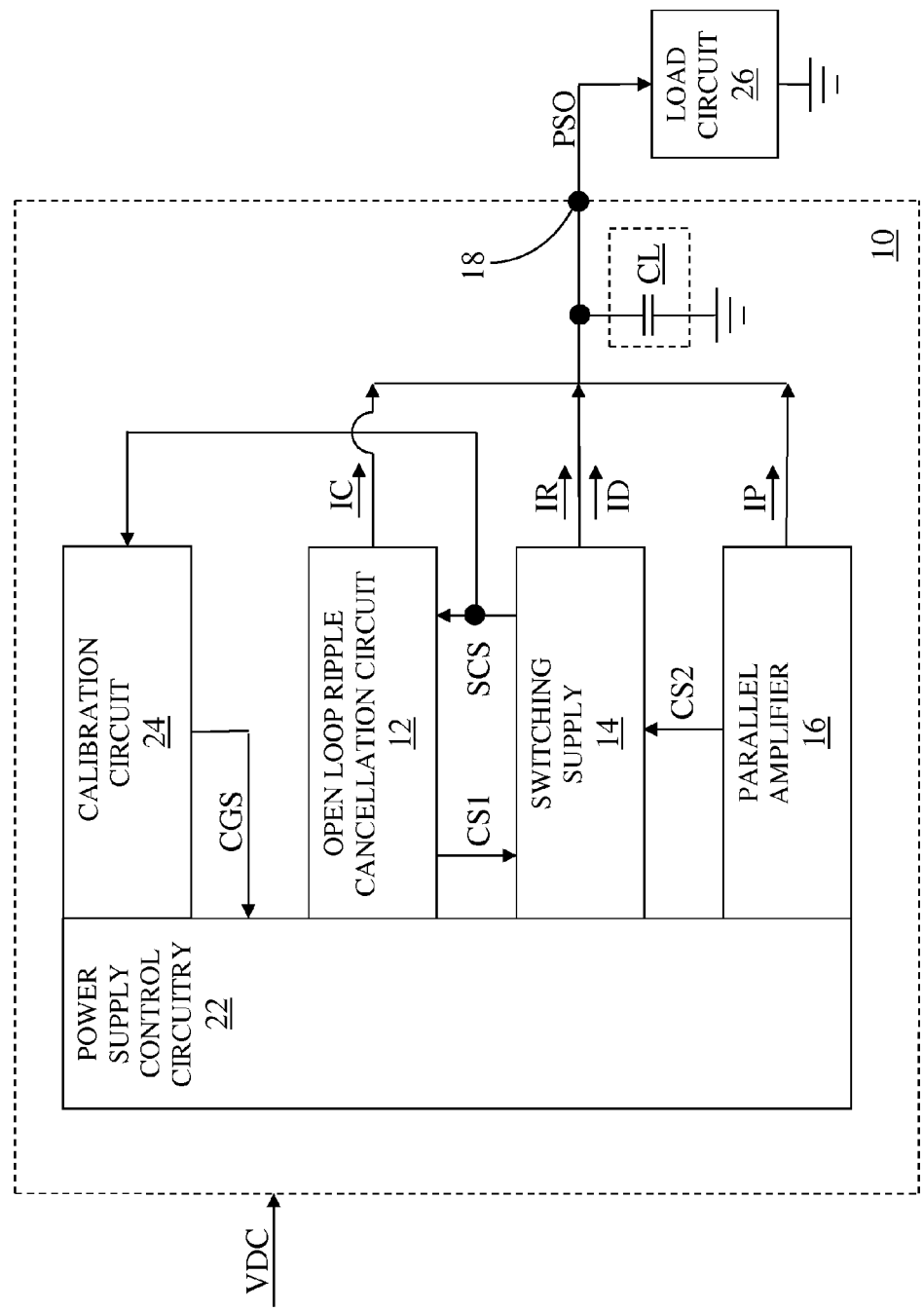
FIG. 2 shows the DC-DC converter according to an alternate embodiment of the DC-DC converter.

FIG. 2 shows the DC-DC converter 10 according to an alternate embodiment of the DC-DC converter 10. The DC-DC converter 10 illustrated in FIG. 2 is similar to the DC-DC converter 10 illustrated in FIG. 1, except the DC-DC converter 10 illustrated in FIG. 2 further includes power supply control circuitry 22 and a calibration circuit 24. Additionally, the DC power source 20 is not shown to simplify FIG. 2 and a load circuit 26 is coupled between the output connection node 18 and the ground. As such, the DC-DC converter 10 provides the power supply output signal PSO to the load circuit 26. In one embodiment of the load circuit 26, the load circuit 26 is sensitive to effects of the ripple current IR. Therefore, the open loop ripple cancellation circuit 12 substantially cancels the effects of the ripple current IR using the ripple cancellation current IC.

The power supply control circuitry 22 is coupled to each of the open loop ripple cancellation circuit 12, the switching supply 14, the parallel amplifier 16, and the calibration circuit 24. As such, the power supply control circuitry 22 may configure, control, or both, each of the open loop ripple cancellation circuit 12, the switching supply 14, the parallel amplifier 16, and the calibration circuit 24. The power supply control circuitry 22 selects either the calibration mode or the normal operation mode. During the normal operation mode, the power supply control circuitry 22 selects the operating current gain of the open loop ripple cancellation circuit 12 based on the estimate of the current gain ECG.

During the calibration mode, the calibration circuit 24 receives the switching control signal SCS and provides an estimated current gain signal CGS to the power supply control circuitry 22. As such, during the calibration mode, the calibration circuit 24 provides the estimate of the current gain ECG to the power supply control circuitry 22 via the estimated current gain signal CGS. In one embodiment of the DC-DC converter 10, during the normal operation mode, the calibration circuit 24 is disabled.

In one embodiment of the DC-DC converter 10, drift in the DC-DC converter 10 may occur. The drift in the DC-DC converter 10 may cause an accuracy error in the ripple cancellation current IC. As a result, the power supply control circuitry 22 periodically toggles between the calibration mode and the normal operation mode to compensate for the drift in the DC-DC converter 10. The drift in the DC-DC converter 10 may be based on changes in an operating temperature of the DC-DC converter 10, changes in the DC source voltage DCV (FIG. 1) of the DC-DC converter 10, changes in the normal operation setpoint of the DC-DC converter 10, other changes of the DC-DC converter 10, or any combination thereof.

Figure 3:
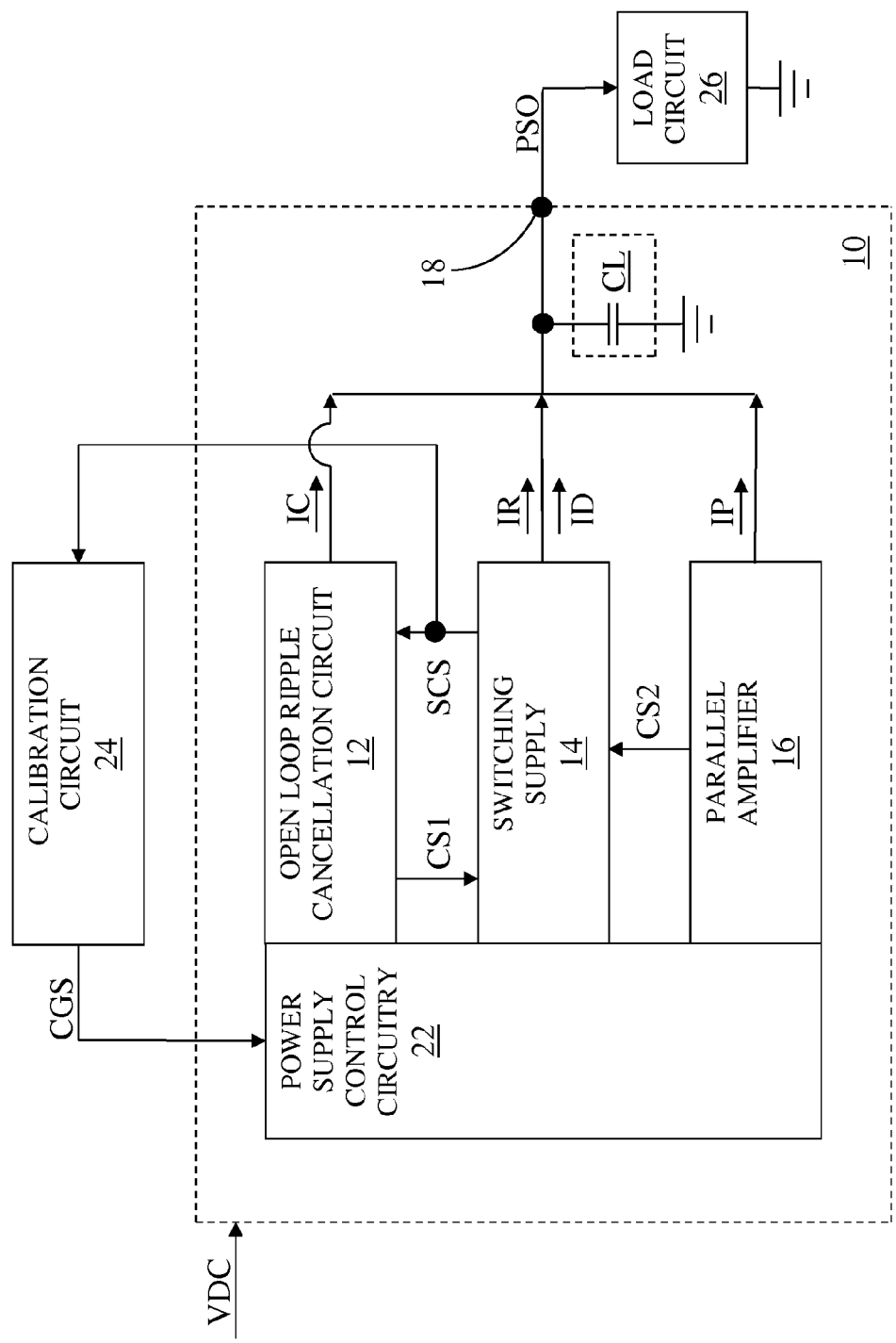
FIG. 3 shows the DC-DC converter according to an additional embodiment of the DC-DC converter.

FIG. 3 shows the DC-DC converter 10 according to an additional embodiment of the DC-DC converter 10. The DC-DC converter 10 illustrated in FIG. 3 is similar to the DC-DC converter 10 illustrated in FIG. 2, except the DC-DC converter 10 illustrated in FIG. 3 does not include the calibration circuit 24. As such, the calibration circuit 24 is external to the DC-DC converter 10. Since the calibration circuit 24 is external to the DC-DC converter 10, it may not be possible to periodically toggle between the calibration mode and the normal operation mode. Therefore, in one embodiment of the DC-DC converter 10, the calibration mode is rarely selected. However, in one embodiment of the DC-DC converter 10, the drift in the DC-DC converter 10 may occur and cause an accuracy error in the ripple cancellation current IC. As a result, the power supply control circuitry 22 compensates for the drift in the DC-DC converter 10 using at least one look-up table.

The drift in the DC-DC converter 10 may be based on changes in an operating temperature of the DC-DC converter 10, changes in the DC source voltage DCV (FIG. 1) of the DC-DC converter 10, changes in the normal operation setpoint of the DC-DC converter 10, other changes of the DC-DC converter 10, or any combination thereof.

Figure 4:
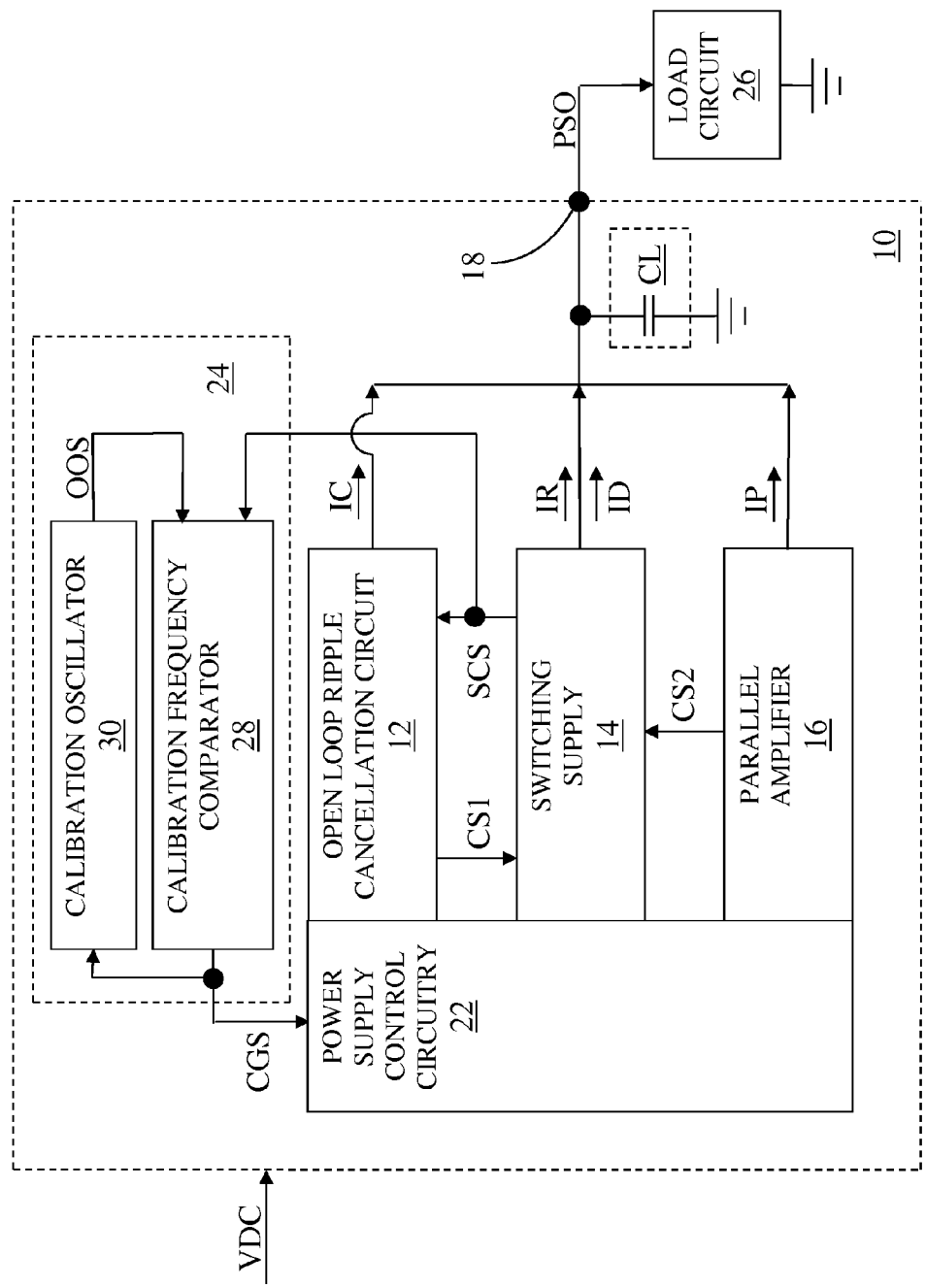
FIG. 4 shows the DC-DC converter according to another embodiment of the DC-DC converter.

FIG. 4 shows the DC-DC converter 10 according to another embodiment of the DC-DC converter 10. The DC-DC converter 10 illustrated in FIG. 4 shows details of the calibration circuit 24 illustrated in FIG. 2. The calibration circuit 24 includes a calibration frequency comparator 28 and a calibration oscillator 30. During the calibration mode, the switching supply 14 provides the switching control signal SCS to the calibration frequency comparator 28, such that the switching control signal SCS has a calibration frequency, which functions as a reference frequency for a frequency locked loop.

During the calibration mode, the calibration oscillator 30 provides an oscillator output signal OOS to the calibration frequency comparator 28. During the calibration mode, the calibration frequency comparator 28 provides the estimated current gain signal CGS to the calibration oscillator 30 and to the power supply control circuitry 22 based on a frequency difference between the switching control signal SCS and the oscillator output signal OOS. As such, the calibration frequency comparator 28 and the calibration oscillator 30 form the frequency locked loop. The calibration oscillator 30 functions as a controlled oscillator, such that as a magnitude of the estimated current gain signal CGS increases, a frequency of the oscillator output signal OOS decreases, and vice versa. Once the frequency locked loop has locked and stabilized, the oscillator output signal OOS has a frequency based on the estimated current gain signal CGS and the estimated current gain signal CGS is representative of the estimate of the current gain ECG. As a result, there is an inverse relationship between the estimate of the current gain ECG and the calibration frequency. In one embodiment of the estimated current gain signal CGS, the estimated current gain signal CGS is a digital word.

In this regard, in one embodiment of the DC-DC converter 10, an exemplary objective of the calibration is to determine the estimate of the current gain ECG, which when used by the open loop ripple cancellation circuit 12 produces the ripple cancellation current IC that maximizes cancellation of the ripple current IR at a desired ripple cancellation frequency. As such, in one embodiment of the DC-DC converter 10, during the normal operation mode, the open loop ripple cancellation circuit 12 operates using the operating current gain to approximately maximize cancellation of the ripple current IR at a desired ripple cancellation frequency. In one embodiment of the desired ripple cancellation frequency, the desired ripple cancellation frequency is equal to about 30 megahertz. In one embodiment of the desired ripple cancellation frequency, the desired ripple cancellation frequency is about equal to an RF duplex frequency.

Figure 5:
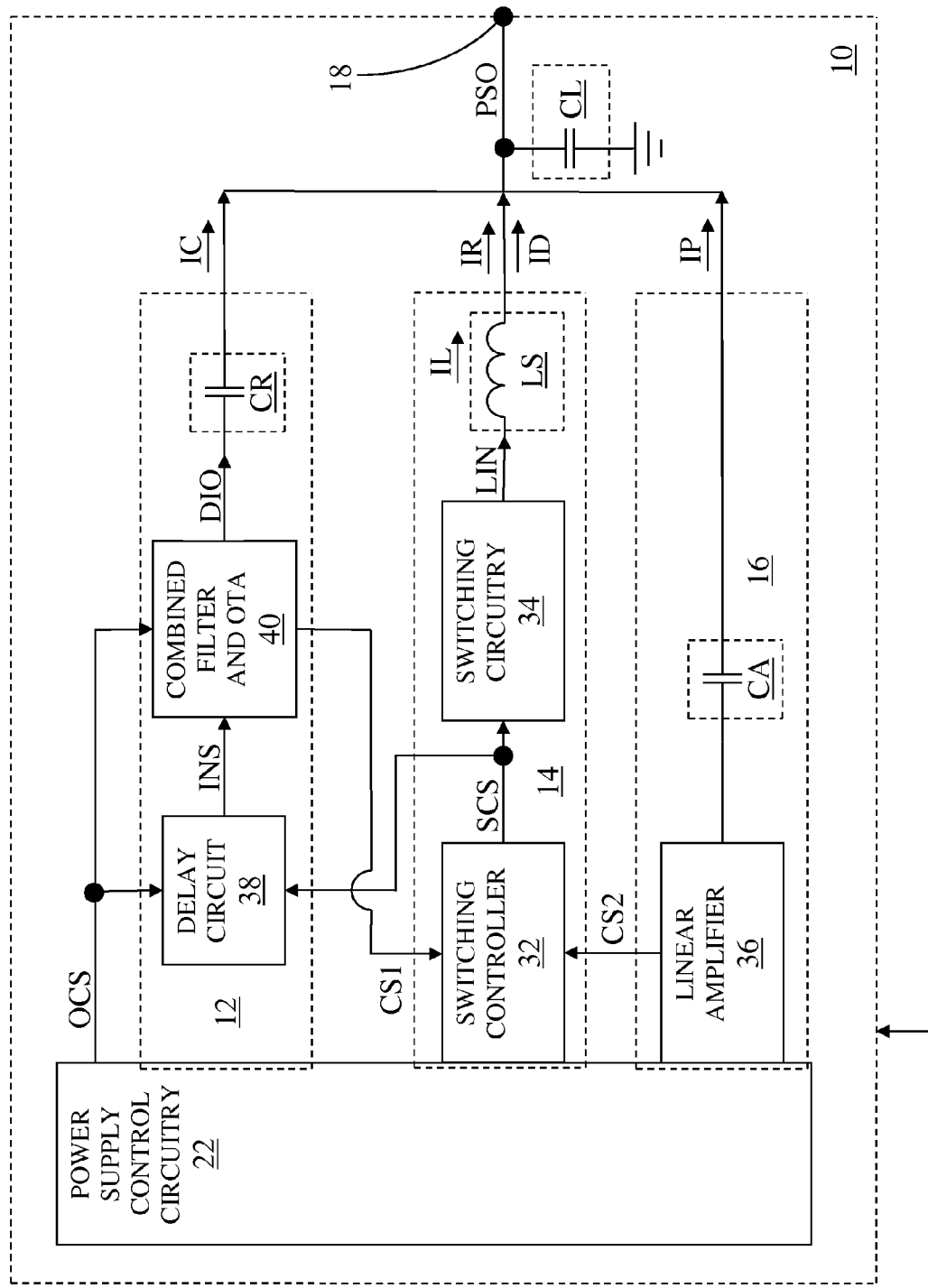
FIG. 5 shows the DC-DC converter according to a further embodiment of the DC-DC converter.

FIG. 5 shows the DC-DC converter 10 according to a further embodiment of the DC-DC converter 10. The DC-DC converter 10 illustrated in FIG. 5 is similar to the DC-DC converter 10 illustrated in FIG. 2, except the DC-DC converter 10 illustrated in FIG. 5 shows details of the open loop ripple cancellation circuit 12, the switching supply 14, and the parallel amplifier 16 according to one embodiment of the open loop ripple cancellation circuit 12, one embodiment of the switching supply 14, and one embodiment of the parallel amplifier 16. Additionally, the calibration circuit 24 and the load circuit 26 are not shown to simplify FIG. 5.

The switching supply 14 includes a switching controller 32, switching circuitry 34, and a switching inductive element LS. The parallel amplifier 16 includes a linear amplifier 36 and a parallel amplifier offset capacitive element CA. The open loop ripple cancellation circuit 12 includes a delay circuit 38, a combined filter and operational transconductance amplifier (OTA) 40, and a ripple circuit offset capacitive element CR.

The switching controller 32, the switching circuitry 34, and the switching inductive element LS are coupled in series between the power supply control circuitry 22 and the output connection node 18. As such, the switching controller 32 is coupled to the power supply control circuitry 22, the switching inductive element LS is coupled to the output connection node 18, and the switching circuitry 34 is coupled between the switching controller 32 and the switching inductive element LS. In this regard, the switching inductive element LS is coupled between the switching circuitry 34 and the output connection node 18.

The delay circuit 38, the combined filter and OTA 40, and the ripple circuit offset capacitive element CR are coupled in series between the power supply control circuitry 22 and the output connection node 18. As such, the delay circuit 38 is coupled to the power supply control circuitry 22, the ripple circuit offset capacitive element CR is coupled to the output connection node 18, and the combined filter and OTA 40 is coupled between the delay circuit 38 and the ripple circuit offset capacitive element CR. In one embodiment of the open loop ripple cancellation circuit 12, the ripple circuit offset capacitive element CR is omitted. Therefore, in general, the delay circuit 38 and the combined filter and OTA 40 are coupled in series to the output connection node 18.

The linear amplifier 36 and the parallel amplifier offset capacitive element CA are coupled in series between the power supply control circuitry 22 and the output connection node 18. As such, the linear amplifier 36 is coupled to the power supply control circuitry 22 and the parallel amplifier offset capacitive element CA is coupled between the linear amplifier 36 and the output connection node 18. In one embodiment of the parallel amplifier 16, the parallel amplifier offset capacitive element CA is omitted. Therefore, in general, the linear amplifier 36 is coupled to the output connection node 18.

During both the calibration mode and the normal operation mode, the linear amplifier 36 provides the parallel amplifier output current IP via the parallel amplifier offset capacitive element CA. As such, the parallel amplifier offset capacitive element CA may have an offset voltage. This offset voltage may allow the parallel amplifier 16 to function properly even if the power supply output voltage PSV (FIG. 1) is greater than the DC source voltage DCV (FIG. 1). The linear amplifier 36 provides the second current sense signal CS2 to the switching controller 32. The second current sense signal CS2 is indicative of the parallel amplifier output current IP from the linear amplifier 36. In an alternate embodiment of the parallel amplifier 16, the parallel amplifier offset capacitive element CA is omitted.

In one embodiment of the combined filter and OTA 40, the combined filter and OTA 40 is coupled to the power supply control circuitry 22 and is powered via the DC source signal VDC. During the calibration mode, the ripple circuit offset capacitive element CR may have an offset voltage. This offset voltage may allow the combined filter and OTA 40 to function properly even if the power supply output voltage PSV (FIG. 1) is greater than the DC source voltage DCV (FIG. 1). In an alternate embodiment of the open loop ripple cancellation circuit 12, the ripple circuit offset capacitive element CR is omitted. In one embodiment of the open loop ripple cancellation circuit 12, a derived output current DIO is fed between the linear amplifier 36 and the parallel amplifier offset capacitive element CA.

In one embodiment of the open loop ripple cancellation circuit 12, during the normal operation mode, the delay circuit 38 receives and delays the switching control signal SCS to provide an input signal INS. Delaying the switching control signal SCS may be needed to properly time-align the ripple cancellation current IC with the ripple current IR. In one embodiment of the power supply control circuitry 22, the power supply control circuitry 22 feeds an OTA configuration signal OCS to the delay circuit 38. The power supply control circuitry 22 controls the delay of the delay circuit 38 via the OTA configuration signal OCS. In another embodiment of the open loop ripple cancellation circuit 12, the delay circuit 38 is fed with an alternate version of the switching control signal SCS, such as an inductor input signal LIN. In an alternate embodiment of the open loop ripple cancellation circuit 12, the delay circuit 38 is omitted.

During the normal operation mode, the combined filter and OTA 40 receives and processes the input signal INS to provide the derived output current DIO. As such, the combined filter and OTA 40 high-pass filters the input signal INS to process only frequencies of interest, such as the desired ripple cancellation frequency. Further, the combined filter and OTA 40 integrates the input signal INS to convert the square wave input signal INS into a triangular wave. Finally, the combined filter and OTA 40 amplifies and inverts the high-pass filtered and integrated input signal INS to provide the proper derived output current DIO based on the operating current gain. The derived output current DIO passes through the ripple circuit offset capacitive element CR to provide the ripple cancellation current IC.

The power supply control circuitry 22 provides the OTA configuration signal OCS to the combined filter and OTA 40. As such, the power supply control circuitry 22 may configure the combined filter and OTA 40 as needed via the OTA configuration signal OCS. The power supply control circuitry 22 may select the operating current gain of the combined filter and OTA 40 via the OTA configuration signal OCS. The selected operating current gain may be represented as a digital word. The combined filter and OTA 40 provides the first current sense signal CS1 to the switching controller 32 based on the derived output current DIO.

During both the calibration mode and the normal operation mode, the switching controller 32 provides the switching control signal SCS to both the switching circuitry 34 and the delay circuit 38. The switching circuitry 34 provides the inductor input signal LIN to the switching inductive element LS based on the switching control signal SCS. The switching inductive element LS has an inductor current IL, which provides the DC current ID and the ripple current IR. In one embodiment of the switching controller 32, the switching controller 32 is a bang-bang controller. As such, the inductor input signal LIN is a square-wave signal, which may have any duty-cycle.

In one embodiment of the switching circuitry 34, during a peak of the square wave signal, the voltage of the inductor input signal LIN is positive with respect to the power supply output voltage PSV (FIG. 1), thereby causing the inductor current IL to increase. Conversely, during a valley of the square wave signal, the voltage of the inductor input signal LIN is negative with respect to the power supply output voltage PSV (FIG. 1), thereby causing the inductor current IL to decrease. As a result, a square wave voltage is developed across the switching inductive element LS. Due to integration by the switching inductive element LS, this square wave voltage produces a triangular wave ripple current in the inductor current IL. This ripple current is undesirable and may be problematic for proper operation of the load circuit 26 (FIG. 2).

In one embodiment of the DC-DC converter 10, during both the calibration mode and the normal operation mode, the switching controller 32 operates to drive the parallel amplifier output current IP toward zero to maximize efficiency based on the second current sense signal CS2. In an alternate embodiment of the DC-DC converter 10, during both the calibration mode and the normal operation mode, the switching controller 32 operates to drive both the ripple cancellation current IC and the parallel amplifier output current IP toward zero to maximize efficiency based on both the first current sense signal CS1 and the second current sense signal CS2.

The switching inductive element LS has an inductance L. In one embodiment of the switching controller 32, during both the calibration mode and the normal operation mode, the frequency of the switching control signal SCS is based on the inductance L of the switching inductive element LS. As such, during the calibration mode, the estimate of the current gain ECG is further based on the inductance L of the switching inductive element LS.

Figure 6:
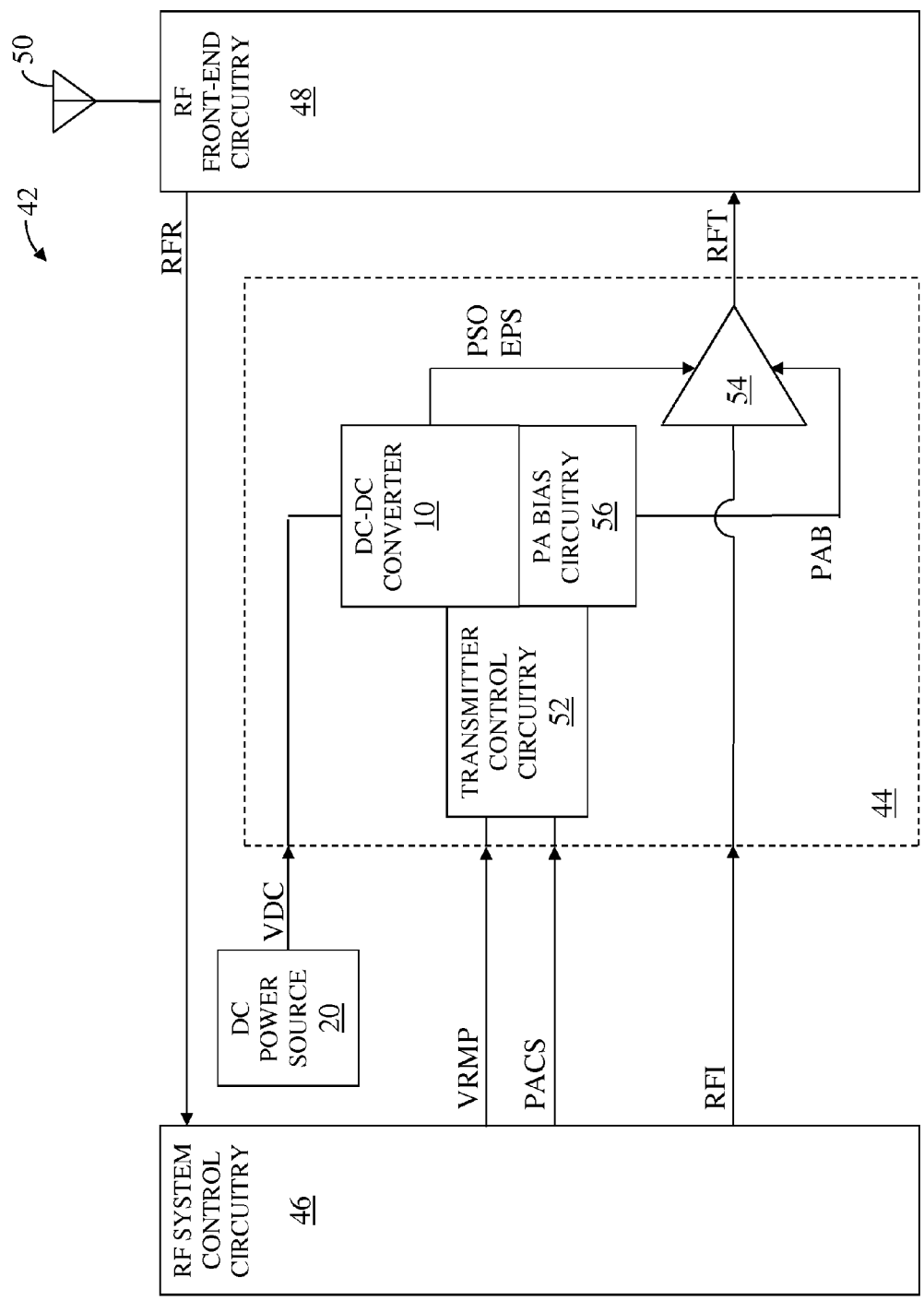
FIG. 6 shows an RF communications system according to one embodiment of the RF communications system.

FIG. 6 shows an RF communications system 42 according to one embodiment of the RF communications system 42.

The RF communications system 42 includes RF transmitter circuitry 44, RF system control circuitry 46, RF front-end circuitry 48, an RF antenna 50, and a DC power source 20. The RF transmitter circuitry 44 includes transmitter control circuitry 52, an RF power amplifier (PA) 54, a DC-DC converter 10, and PA bias circuitry 56.

In one embodiment of the RF communications system 42, the RF front-end circuitry 48 receives via the RF antenna 50, processes, and forwards an RF receive signal RFR to the RF system control circuitry 46. The RF system control circuitry 46 provides an envelope power supply control signal VRMP and a transmitter configuration signal PACS to the transmitter control circuitry 52. The RF system control circuitry 46 provides an RF input signal RFI to the RF PA 54. The DC power source 20 provides the DC source signal VDC to the DC-DC converter 10.

The transmitter control circuitry 52 is coupled to the DC-DC converter 10 and to the PA bias circuitry 56. The DC-DC converter 10 provides the power supply output signal PSO to the RF PA 54 based on the envelope power supply control signal VRMP. As such, the power supply output signal PSO is an envelope power supply signal EPS. The DC source signal VDC provides power to the DC-DC converter 10. As such, the envelope power supply signal EPS is based on the DC source signal VDC. The envelope power supply control signal VRMP is representative of a setpoint of the envelope power supply signal EPS. The RF PA 54 receives and amplifies the RF input signal RFI to provide an RF transmit signal RFT using the envelope power supply signal EPS. The envelope power supply signal EPS provides power for amplification. The RF front-end circuitry 48 receives, processes, and transmits the RF transmit signal RFT via the RF antenna 50. In one embodiment of the RF transmitter circuitry 44, the transmitter control circuitry 52 configures the RF transmitter circuitry 44 based on the transmitter configuration signal PACS.

The PA bias circuitry 56 provides a PA bias signal PAB to the RF PA 54. In this regard, the PA bias circuitry 56 biases the RF PA 54 via the PA bias signal PAB. In one embodiment of the PA bias circuitry 56, the PA bias circuitry 56 biases the RF PA 54 based on the transmitter configuration signal PACS. In one embodiment of the RF front-end circuitry 48, the RF front-end circuitry 48 includes at least one RF switch, at least one RF amplifier, at least one RF filter, at least one RF duplexer, at least one RF diplexer, at least one RF amplifier, the like, or any combination thereof. In one embodiment of the RF system control circuitry 46, the RF system control circuitry 46 is RF transceiver circuitry, which may include an RF transceiver IC, baseband controller circuitry, the like, or any combination thereof. In one embodiment of the RF transmitter circuitry 44, the DC-DC converter 10 provides the envelope power supply signal EPS, which has switching ripple. In one embodiment of the RF transmitter circuitry 44, the envelope power supply signal EPS provides power for amplification and envelope tracks the RF transmit signal RFT.

In one embodiment of the RF communications system 42, the RF duplex frequency is equal to a difference between a frequency of the RF input signal RFI and a frequency of the RF transmit signal RFT. As a result, when the envelope power supply signal EPS envelope tracks the RF transmit signal RFT, noise from the envelope power supply signal EPS may interfere with the RF input signal RFI. This interfering noise may be at the RF duplex frequency. Therefore, to reduce interference with the RF input signal RFI, in one embodiment of the desired ripple cancellation frequency, the desired ripple cancellation frequency is about equal to the RF duplex frequency. As such, in an exemplary embodiment of the desired ripple cancellation frequency, the desired ripple cancellation frequency is equal to about 30 megahertz, which is about equal to the RF duplex frequency. In one embodiment of the RF communications system 42, the RF system control circuitry 46 selects either the calibration mode or the normal operation mode and conveys the mode selection to the DC-DC converter 10 via the transmitter configuration signal PACS and the transmitter control circuitry 52.

Figure 7:
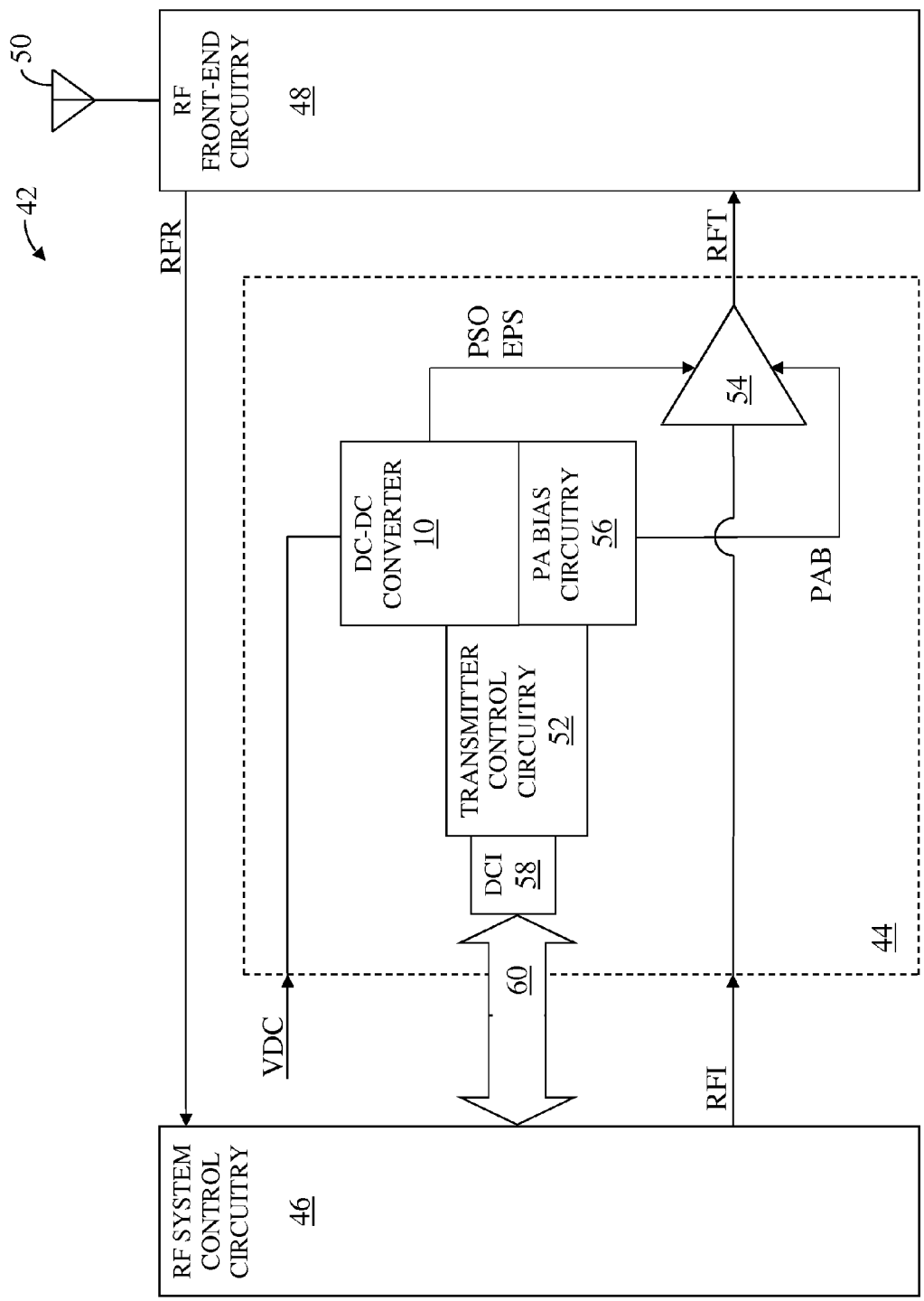
FIG. 7 shows the RF communications system according to an alternate embodiment of the RF communications system.

FIG. 7 shows the RF communications system 42 according to an alternate embodiment of the RF communications system 42. The RF communications system 42 illustrated in FIG. 7 is similar to the RF communications system 42 illustrated in FIG. 6, except in the RF communications system 42 illustrated in FIG. 7, the RF transmitter circuitry 44 further includes a digital communications interface 58, which is coupled between the transmitter control circuitry 52 and a digital communications bus 60. The digital communications bus 60 is also coupled to the RF system control circuitry 46. As such, the RF system control circuitry 46 provides the envelope power supply control signal VRMP (FIG. 6) and the transmitter configuration signal PACS (FIG. 6) to the transmitter control circuitry 52 via the digital communications bus 60 and the digital communications interface 58.

Figure 8:
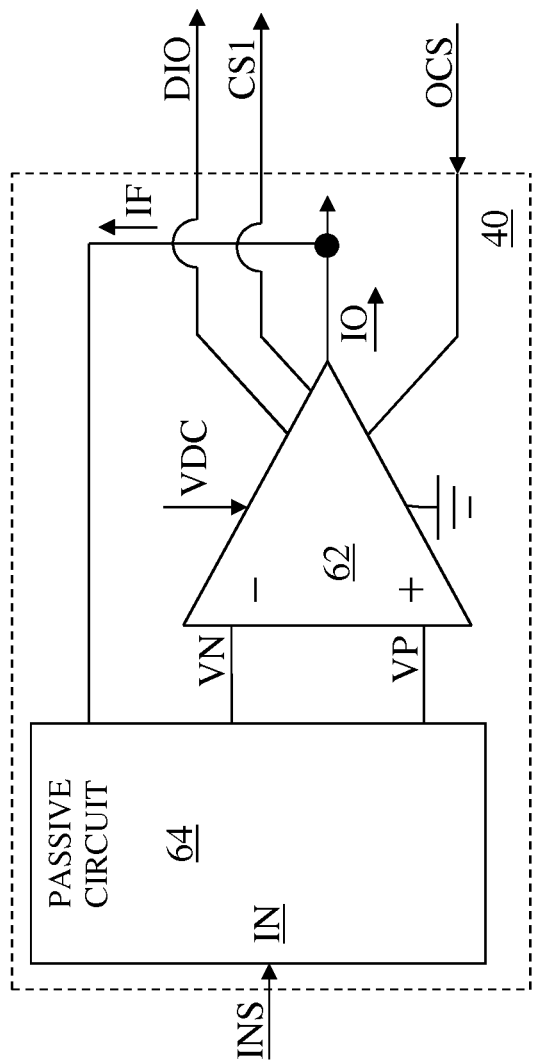
FIG. 8 shows details of a combined filter and operational transconductance amplifier (OTA) illustrated in FIG. 5 according to one embodiment of the combined filter and OTA.

FIG. 8 shows details of the combined filter and OTA 40 illustrated in FIG. 5 according to one embodiment of the combined filter and OTA 40. The combined filter and OTA 40 includes an OTA 62 and a passive circuit 64. As such, the OTA 62 and the passive circuit 64 provide the combined filter and OTA 40. The OTA 62 is coupled to the passive circuit 64. Specifically, an inverting input to the OTA 62, a non-inverting input to the OTA 62, and an output from the OTA 62 are coupled to the passive circuit 64. The passive circuit 64 receives the input signal INS via an input IN to the passive circuit 64 and the OTA 62 provides an output current IO, such that the passive circuit 64 and the OTA 62 high-pass filter and integrate the input signal INS to provide the output current IO. A portion of the output current IO is fed back to the passive circuit 64. A feedback current IF is the portion of the output current IO that is fed back to the passive circuit 64. In one embodiment of the passive circuit 64, the passive circuit 64 does not include any active elements. In this regard, the input signal INS is received via the passive circuit 64 and the output current IO is provided via the OTA 62. The input signal INS is high-pass filtered and integrated to provide the output current IO using the passive circuit 64 and the OTA 62.

In one embodiment of the combined filter and OTA 40, the OTA 62 is a single OTA. By combining high-pass filter, integrator, and transconductance functions using the single OTA, the combined filter and OTA 40 may operate with a higher bandwidth than if multiple OTAs were used. As a result, for a given process technology, a bandwidth of the combined filter and OTA 40 may be maximized, thereby maximizing an allowable bandwidth of the input signal INS. The OTA 62 receives a positive-side input voltage VP at the non-inverting input to the OTA 62. Further, the OTA 62 receives a negative-side input voltage VN at the inverting input to the OTA 62. The OTA 62 provides the output current IO based on a voltage difference between the positive-side input voltage VP and the negative-side input voltage VN. Specifically, the voltage difference is equal to a magnitude of the positive-side input voltage VP minus a magnitude of the negative-side input voltage VN. In this regard, since the OTA 62 provides the output current IO based on the voltage difference, the OTA 62 functions as a transconductance amplifier. As such, a transconductance GM of the OTA 62 is equal to a magnitude of the output current IO divided by the voltage difference. Additionally, the OTA 62 receives the DC source signal VDC to provide power to the OTA 62.

The OTA 62 further provides the derived output current DIO and the first current sense signal CS1, and receives the OTA configuration signal OCS. The first current sense signal CS1 is based on the derived output current DIO, such that the first current sense signal CS1 is representative of the derived output current DIO. In one embodiment of the first current sense signal CS1, the first current sense signal CS1 is about proportional to the derived output current DIO. In one embodiment of the first current sense signal CS1, the first current sense signal CS1 is based on a mirror current of the output current IO. In one embodiment of the first current sense signal CS1, a magnitude of the first current sense signal CS1 is about equal to a first current scaling factor times a magnitude of the derived output current DIO. In one embodiment of the OTA 62, the first current sense signal CS1 is programmable. As such, in one embodiment of the OTA 62, the first current scaling factor is programmable. In this regard, in one embodiment of the OTA 62, a magnitude of the first current sense signal CS1 is programmable. In one embodiment of the first current sense signal CS1, the first current sense signal CS1 is a voltage signal. In an alternate embodiment of the first current sense signal CS1, the first current sense signal CS1 is a current signal.

In one embodiment of the OTA 62, the derived output current DIO is programmable, such that the derived output current DIO is based on the output current IO and the OTA configuration signal OCS. In one embodiment of the derived output current DIO, the magnitude of the derived output current DIO is about equal to the operating current gain OCG times a magnitude of the output current IO, such that the operating current gain OCG is based on the OTA configuration signal OCS, as shown in EQ. 1 below.

$$DIO = OCG * IO. \qquad \text{EQ. 1:}$$

In one embodiment of the OTA 62, the first current sense signal CS1 is programmable, such that the first current sense signal CS1 is based on the derived output current DIO and the OTA configuration signal OCS. In one embodiment of the first current sense signal CS1, the magnitude of the first current sense signal CS1 is about equal to the first current scaling factor times a magnitude of the derived output current DIO, such that the first current scaling factor is based on the OTA configuration signal OCS. In one embodiment of the OTA 62, both the first current scaling factor and the operating current gain OCG are based on the OTA configuration signal OCS.

Figure 9:
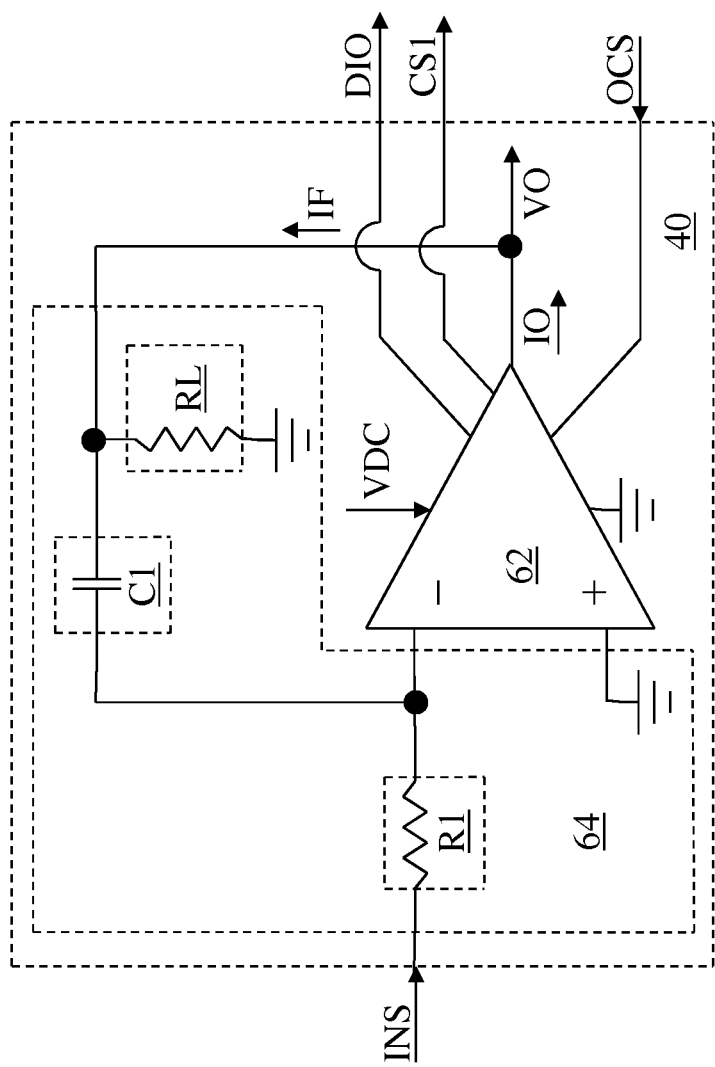
FIG. 9 shows details of the combined filter and operational transconductance amplifier (OTA) illustrated in FIG. 5 according to an alternate embodiment of the combined filter and OTA.

FIG. 9 shows equivalent functional details of the combined filter and OTA 40 illustrated in FIG. 5 when the combined filter and OTA 40 is providing the output current IO at the desired ripple cancellation frequency DRF according to one embodiment of the combined filter and OTA 40. The combined filter and OTA 40 illustrated in FIG. 9 is similar to the combined filter and OTA 40 illustrated in FIG. 8, except in the combined filter and OTA 40 illustrated in FIG. 9, during the normal operation mode, the OTA 62 provides an output voltage VO, and a functional equivalent of the passive circuit 64 at the desired ripple cancellation frequency DRF includes a load resistive element RL, a first resistive element R1, and a first capacitive element C1.

The load resistive element RL has a load resistance LR, the first resistive element R1 has a first resistance 1R, and the first capacitive element C1 has a first capacitance 1C. The load resistive element RL is coupled between an output from the OTA 62 and the ground. The first capacitive element C1 is coupled between the output from the OTA 62 and the inverting input to the OTA 62. The first resistive element R1 is coupled between the input IN to the passive circuit 64 and the inverting input to the OTA 62. The non-inverting input to the OTA 62 is coupled to the ground. An "s" operator is defined by EQ. 2, as shown below.

$$s = j*2*\pi*DRF, \qquad \text{EQ. 2:}$$

where j is an imaginary complex operator, π is equal to about 3.14159, and DRF is the desired ripple cancellation frequency DRF. Normally, the OTA 62 will drive the inverting input to the OTA 62 to be about equal to the non-inverting input to the OTA 62. The input signal INS has an input voltage V1. Therefore, a voltage transfer function VTF of the combined filter and OTA 40 is shown in EQ. 3, below.

$$VTF = VO/VI = -1/(s*1R*1C). \qquad \text{EQ. 3:}$$

If we assume that the current in the first capacitive element C1 is small compared to the current in the load resistive element RL, then the output current IO is shown in EQ. 4, below.

$$IO = VO/LR. \qquad \text{EQ. 4:}$$

Combining EQ. 1, EQ. 3, and EQ. 4, produces a voltage to current transfer function VITF of the combined filter and OTA 40, which is shown in EQ. 5, below.

$$VITF = DIO/VI = -OCG/(s*1R*1C*LR). \qquad \text{EQ. 5:}$$

Since the ripple cancellation current IC is equal to the derived output current DIO, EQ. 5 may be rearranged and expressed in terms of the ripple cancellation current IC (FIG. 5), as shown in EQ. 6, below.

$$IC = -(VI*OCG)/(s*1R*1C*LR). \qquad \text{EQ. 6:}$$

An inductor voltage LV is the voltage across the switching inductive element LS (FIG. 5) during the normal operation mode. As such, the inductor voltage LV is about proportional to the input voltage V1, as shown in EQ. 7, below.

$$LV = k*VI. \qquad \text{EQ. 7:}$$

The ripple current IR (FIG. 5) is based on the inductance L of the switching inductive element LS (FIG. 5) and the inductor voltage LV, as shown in EQ. 8, below.

$$LV = k*VI = s*L*IR. \qquad \text{EQ. 8:}$$

To maximize cancellation of the ripple current IR (FIG. 5), the ripple cancellation current IC (FIG. 5) must be about equal and inverted to the ripple current IR (FIG. 5), as shown in EQ. 9, below.

$$IC = -IR. \qquad \text{EQ. 9:}$$

Substituting EQ. 6 and EQ. 8 into EQ. 9 and rearranging provides EQ. 10, as shown below.

$$-(VI*OCG)/(s*1R*1C*LR) = -(k*VI)/(s*L). \qquad \text{EQ. 10:}$$

Simplifying and solving EQ. 10 for the operating current gain OCG provides EQ. 11, as shown below.

$$OCG = (k*1R*1C*LR)/L. \qquad \text{EQ. 11:}$$

By examining EQ. 11, for maximum ripple cancellation, the operating current gain OCG is dependent on the load resistive element RL, the first resistive element R1, the first capacitive element C1, and the switching inductive element LS (FIG. 5). As such, if initial tolerances of any or all of the load resistive element RL, the first resistive element R1, the first capacitive element C1, and the switching inductive element LS (FIG. 5) are loose, then an initial calibration of the open loop ripple cancellation circuit 12 (FIG. 5) may be needed. For example, in some embodiments of the switching inductive element LS (FIG. 5), an initial tolerance of the switching inductive element LS (FIG. 5) is on the order of about plus or minus twenty percent. Further, if values of any or all of the load resistive element RL, the first resistive element R1, the first capacitive element C1, and the switching inductive element LS (FIG. 5) drift over time, temperature, humidity, etc., then periodic calibrations may be needed, one or more look-up table may be used, or both.

Figure 10:
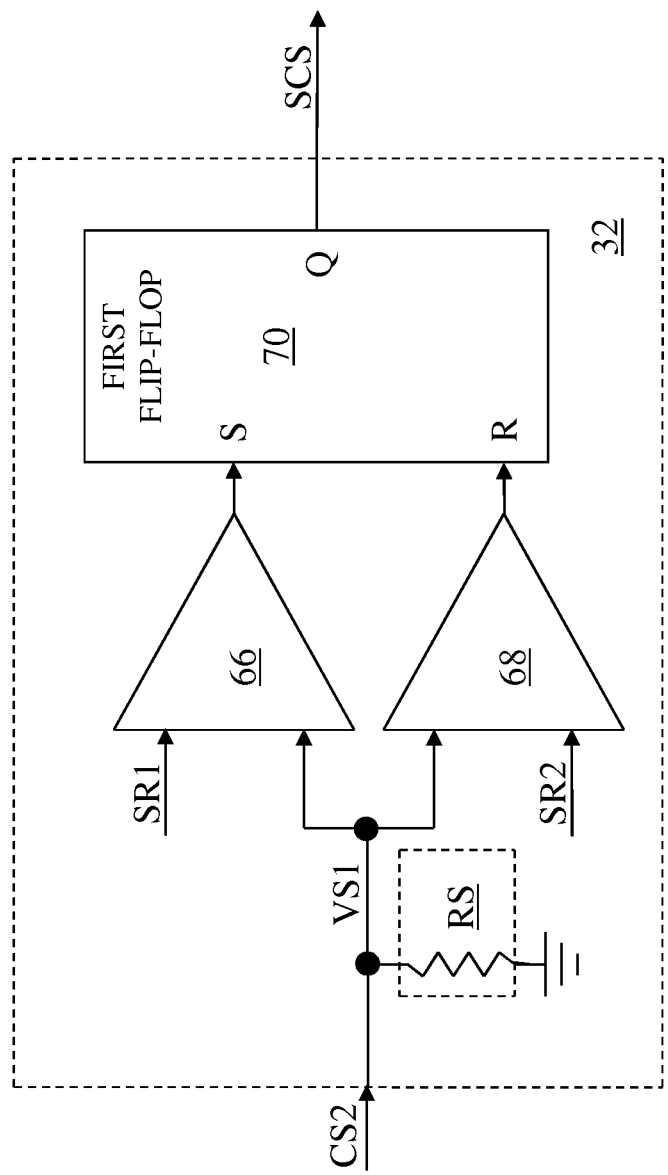
FIG. 10 shows details of a switching controller illustrated in FIG. 5 according to one embodiment of the switching controller.

FIG. 10 shows details of the switching controller 32 illustrated in FIG. 5 according to one embodiment of the switching controller 32. The switching controller 32 includes a first comparator 66, a second comparator 68, a first flip-flop 70, and a sense resistive element RS. The sense resistive element RS is coupled between the parallel amplifier 16 (FIG. 5) and the ground. The first comparator 66 is coupled between the sense resistive element RS and a set input S to the first flip-flop 70. The second comparator 68 is coupled between the sense resistive element RS and a reset input R to the first flip-flop 70.

As previously mentioned, in one embodiment of the DC-DC converter 10, during both the calibration mode and the normal operation mode, the switching supply 14 (FIG. 5) drives an output current from the parallel amplifier 16 (FIG. 5) toward zero based on the second current sense signal CS2. As such, the second current sense signal CS2 may toggle about a threshold value of the second current sense signal CS2 that is indicative of zero current from the parallel amplifier 16 (FIG. 5). The second current sense signal CS2 is fed through the sense resistive element RS, thereby developing a first sense voltage VS1, which is fed to inputs to the first comparator 66 and the second comparator 68. Other inputs to the first comparator 66 and the second comparator 68 receive a first reference signal SR1 and a second reference signal SR2, respectively. The first reference signal SR1 and the second reference signal SR2 straddle a switching point that corresponds to the threshold value of the second current sense signal CS2. As the output current from the parallel amplifier 16 (FIG. 5) toggles about zero, the first comparator 66 and the second comparator 68 set and reset, respectively, the first flip-flop 70. An output Q from the first flip-flop 70 provides the switching control signal SCS. A frequency of the switching control signal SCS is based on a frequency of the toggling of the output current from the parallel amplifier 16 (FIG. 5).

An exemplary calibration embodiment of the DC-DC converter 10 (FIG. 5) is presented in which the DC-DC converter 10 (FIG. 5) is calibrated. As such, in the exemplary calibration embodiment of the DC-DC converter 10 (FIG. 5), the DC-DC converter 10 (FIG. 5) is in the calibration mode. The parallel amplifier 16 (FIG. 5) drives the power supply output voltage PSV (FIG. 1) to be equal to about one-half of the DC source voltage DCV (FIG. 1), as shown in EQ. 12, below.

$$PSV=DCV/2. \quad \text{EQ. 12:}$$

As a result, the DC current ID (FIG. 5) is constant and the ripple current IR (FIG. 5) is about equal to and inverted from the parallel amplifier output current IP (FIG. 5), as shown in EQ. 13, below.

$$IP=-IR. \quad \text{EQ. 13:}$$

In one embodiment of the DC current ID (FIG. 5), the DC current ID (FIG. 5) is equal to about zero volts. During a SET condition of the switching controller 32 (FIG. 5), the switching control signal SCS (FIG. 5) is a logic HIGH and the inductor input signal LIN (FIG. 5) is about equal to the DC source voltage DCV (FIG. 1). During a RESET condition of the switching controller 32 (FIG. 5), the switching control signal SCS (FIG. 5) is a logic LOW and the inductor input signal LIN (FIG. 5) is about equal to zero volts.

As such, during the SET condition of the switching controller 32 (FIG. 5), a voltage across the switching inductive element LS (FIG. 5) VLD is maintained at about one-half of the DC source voltage DCV (FIG. 1), as shown in EQ. 14, below.

$$VLD=DCV/2. \quad \text{EQ. 14:}$$

During the RESET condition of the switching controller 32 (FIG. 5), the voltage across the switching inductive element LS (FIG. 5) VLD is maintained at about negative one-half of the DC source voltage DCV (FIG. 1), as shown in EQ. 15, below.

$$VLD=-DCV/2. \quad \text{EQ. 15:}$$

During the SET condition of the switching controller 32 (FIG. 5), a change in the ripple current IR (FIG. 5) IRC is positive for a SET condition duration SCD, as shown in EQ. 16, below.

$$SCD=(IRC*L)/VLD=(IRC*L)/(DCV/2). \quad \text{EQ. 16:}$$

During the RESET condition of the switching controller 32 (FIG. 5), a change in the ripple current IR (FIG. 5) IRC is negative for a RESET condition duration RCD, as shown in EQ. 17, below.

$$RCD=(-IRC*L)/VLD=(-IRC*L)/(-DCV/2)=SCD. \quad \text{EQ. 17:}$$

A period of the switching control signal SCS (FIG. 5) TSCS is equal to a sum of the SET condition duration SCD and the RESET condition duration RCD, as shown in EQ. 18, below.

$$TSCS=SCD+RCD. \quad \text{EQ. 18:}$$

A frequency of the switching control signal SCS (FIG. 5) FSCS is equal to a reciprocal of the period of the switching control signal SCS (FIG. 5) TSCS, as shown in EQ. 19, below.

$$FSCS=1/TSCS. \quad \text{EQ. 19:}$$

The second current sense signal CS2 has a DC offset DCO and is based on the parallel amplifier output current IP (FIG. 5), as shown in EQ. 20, below.

$$CS2=(IP/M)+DCO, \quad \text{EQ. 20:}$$

where M is a scaling factor. The DC offset DCO is used, such that the second current sense signal CS2 is always positive. The first sense voltage VS1 is equal to a product of the second current sense signal CS2 and a resistance SR of the sense resistive element RS, as shown in EQ. 21, below.

$$VS1=CS2*SR=(SR*IP)/M+(DCO*SR). \quad \text{EQ. 21:}$$

A first voltage difference VD1 is a difference between a voltage of the first reference signal SR1 and a voltage of the second reference signal SR2. Therefore, during the RESET condition duration RCD, the first sense voltage VS1 traverses the first voltage difference VD1 in an increasing manner. Conversely, during the SET condition duration SCD, the first sense voltage VS1 traverses the first voltage difference VD1 in a decreasing manner. The first voltage difference VD1 corresponds to first current difference ID1, which represents a parallel amplifier output current IP (FIG. 5) difference. Substituting, the first voltage difference VD1 and the first current difference ID1 into EQ. 21 produces EQ. 22, as shown below.

$$VD1=(SR*ID1)/M. \quad \text{EQ. 22:}$$

Note that when differences are taken, the (DCO*SR) term is cancelled. Further, the change in the ripple current IR (FIG. 5) IRC corresponds with the first current difference ID1. Therefore, substituting EQ. 22 into EQ. 16 produces EQ. 23, as shown below.

$$SCD=(IRC*L)/(DCV/2)=(2*M*VD1*L)/(SR*DCV). \quad \text{EQ. 23:}$$

Further, by combining EQ. 17, EQ. 18, EQ. 19, and EQ. 23, the frequency of the switching control signal SCS (FIG. 5) FSCS is provided, as shown in EQ. 24, below.

$$FSCS=(SR*DCV)/(4*M*VD1*L).\qquad\text{EQ. 24:}$$

Figure 11:
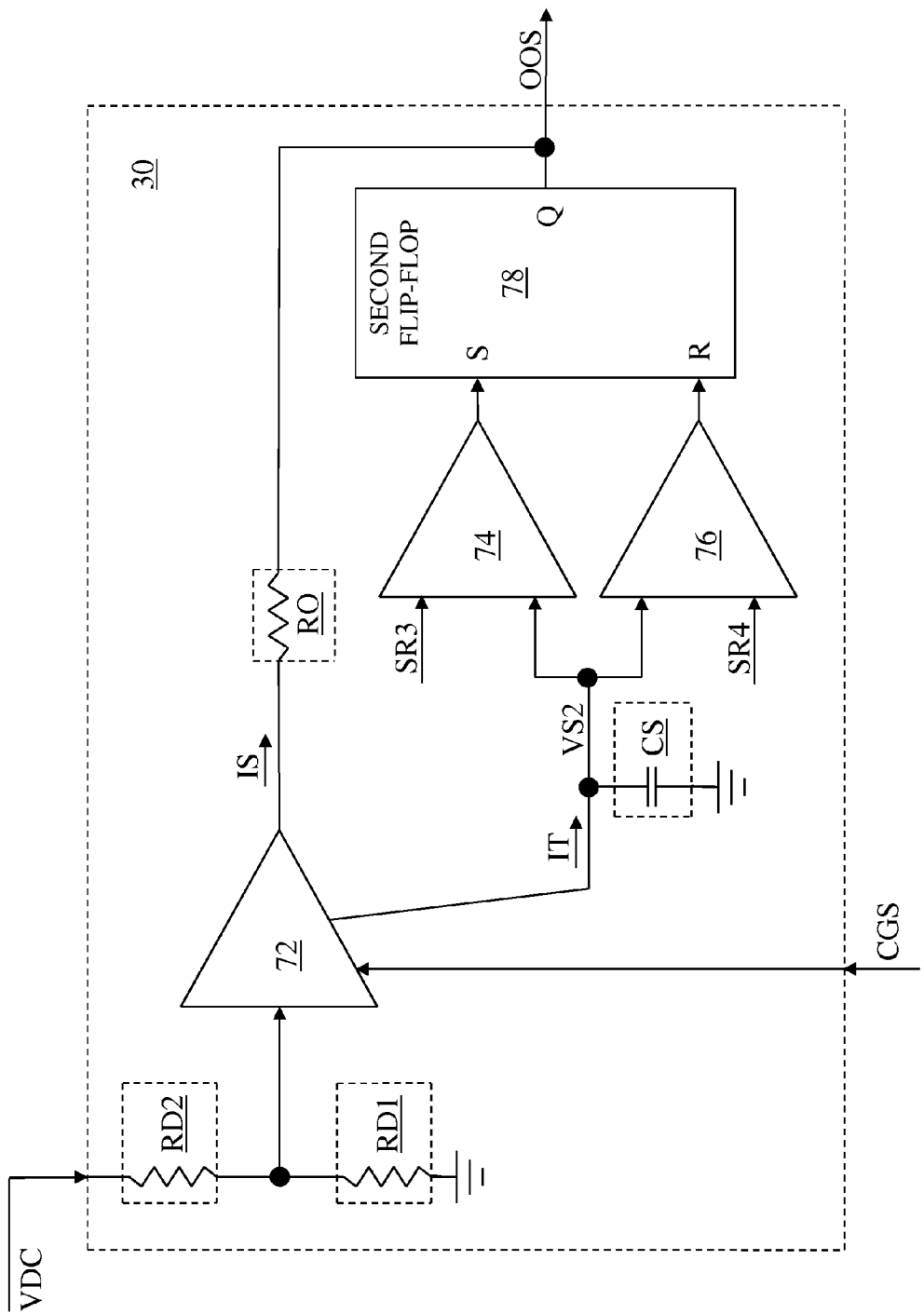
FIG. 11 shows details of a calibration oscillator illustrated in FIG. 4 according to one embodiment of the calibration oscillator.

FIG. 11 shows details of the calibration oscillator 30 illustrated in FIG. 4 according to one embodiment of the calibration oscillator 30. The calibration oscillator 30 includes an oscillator amplifier 72, a third comparator 74, a fourth comparator 76, a second flip-flop 78, a sense capacitive element CS, an oscillator resistive element RO, a first divider resistive element RD1, and a second divider resistive element RD2. The sense capacitive element CS has a sense capacitance SC and the oscillator resistive element RO has an oscillator resistance OR.

The first divider resistive element RD1 is coupled between an input to the oscillator amplifier 72 and the ground. The second divider resistive element RD2 is coupled between the input to the oscillator amplifier 72 and the DC power source 20 (FIG. 1). The oscillator resistive element RO is coupled between a primary output from the oscillator amplifier 72 and an output Q from the second flip-flop 78. The sense capacitive element CS is coupled between a sense output from the oscillator amplifier 72 and the ground. The third comparator 74 is coupled between the sense capacitive element CS and a set input S to the second flip-flop 78. The fourth comparator 76 is coupled between the sense capacitive element CS and a reset input R to the second flip-flop 78.

In one embodiment of the calibration oscillator 30, during the calibration mode, the calibration oscillator 30 mimics behavior of the switching controller 32 (FIG. 5) to determine the estimate of the current gain ECG. Therefore, during the calibration mode, the first divider resistive element RD1 and the second divider resistive element RD2 form a voltage divider to provide a calibration reference voltage to the input to the oscillator amplifier 72. As such, during the calibration mode, the oscillator amplifier 72 provides the calibration reference voltage from the primary output to the oscillator resistive element RO.

The oscillator amplifier 72 provides an oscillator current IS from the primary output and a capacitor current IT from the sense output. During the calibration mode, the oscillator amplifier 72 receives the estimated current gain signal CGS, such that a current gain of the oscillator amplifier 72 is based on the estimated current gain signal CGS. The oscillator amplifier 72 regulates the voltage from the primary output to maintain the calibration reference voltage. Therefore, the oscillator current IS will be based on downstream circuitry. As a result, the oscillator amplifier 72 will regulate the capacitor current IT to maintain the current gain specified by the estimated current gain signal CGS. In one embodiment of the oscillator amplifier 72, the capacitor current IT is related to the oscillator current IS as shown in EQ. 25, below.

$$IT=(ECG*IS)/N,\text{ where } N \text{ is a scaling factor.}\qquad\text{EQ. 25:}$$

Since the oscillator amplifier 72 regulates the capacitor current IT during the calibration mode, the capacitor current IT may toggle about a calibration threshold value. The capacitor current IT is fed through the sense capacitive element CS, thereby developing a second sense voltage VS2, which is fed to inputs to the third comparator 74 and the fourth comparator 76. Other inputs to the third comparator 74 and the fourth comparator 76 receive a third reference signal SR3 and a fourth reference signal SR4, respectively. The third reference signal SR3 and the fourth reference signal SR4 straddle a calibration switching point that corresponds to the calibration threshold value of the capacitor current IT. As the oscillator current IS and the capacitor current IT toggle back and forth, the third comparator 74 and the fourth comparator 76 set and reset, respectively, the second flip-flop 78. An output Q from the second flip-flop 78 provides the oscillator output signal OOS. A frequency of the oscillator output signal OOS is based on a frequency of the toggling of the capacitor current IT.

In the exemplary calibration embodiment of the DC-DC converter 10 (FIG. 5) described above, the DC-DC converter 10 (FIG. 5) is in the calibration mode. The exemplary calibration embodiment of the DC-DC converter 10 (FIG. 5) as it pertains to the calibration oscillator 30 is presented. As such, the oscillator amplifier 72 mimics the parallel amplifier 16 (FIG. 5), the third comparator 74 mimics the first comparator 66 (FIG. 10), the fourth comparator 76 mimics the second comparator 68 (FIG. 10), and the sense capacitive element CS and the oscillator resistive element RO in combination mimic behavior of the switching inductive element LS (FIG. 5). The oscillator amplifier 72 regulates its output voltage to be equal to about one-half of the DC source voltage DCV (FIG. 1). In this regard, the capacitor current IT is based on the oscillator current IS as shown in EQ. 26, below.

$$IT=(ECG*DCV)/(2*N*OR).\qquad\text{EQ. 26:}$$

A frequency of the oscillator output signal OOS (FOOS) is provided by EQ. 27, as shown below.

$$FOOS=(ECG*DCV)/(4*N*VD1*OR*SC).\qquad\text{EQ. 27:}$$

By adjusting the estimate of the current gain ECG, the frequency of the oscillator output signal OOS (FOOS) can be made to equal the frequency of the switching control signal SCS (FIG. 5) FSCS, thereby calibrating the DC-DC converter 10 (FIG. 5).

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the embodiments of the present disclosure. All such improvements and modifications are considered within the scope of the concepts disclosed herein and the claims that follow.

What is claimed is:

1. Circuitry comprising:
   a parallel amplifier configured to during a calibration mode, regulate a power supply output voltage based on a calibration setpoint;
   a switching supply configured to drive a parallel amplifier output current toward zero using a switching control signal, such that during the calibration mode, an estimate of a current gain is based on the switching control signal; and
   an open loop ripple cancellation circuit configured to:
   during the calibration mode, be disabled; and
   during a normal operation mode, provide a ripple cancellation current based on the estimate of the current gain.

2. The circuitry of claim 1 further comprising a direct current (DC)-DC converter, which comprises the parallel amplifier, the switching supply, and the open loop ripple cancellation circuit.

3. The circuitry of claim 2 wherein the DC-DC converter further comprises power supply control circuitry configured to select one of the normal operation mode and the calibration mode.

4. The circuitry of claim 3 wherein during the normal operation mode, an operating current gain of the open loop ripple cancellation circuit is based on the estimate of the current gain.

5. The circuitry of claim 3 wherein during the calibration mode, a calibration circuit is further configured to provide the estimate of the current gain to the power supply control circuitry via an estimated current gain signal.

6. The circuitry of claim 3 further comprising a calibration circuit, such that:
the calibration circuit is configured to receive the switching control signal and provide the estimate of the current gain; and
the power supply control circuitry is further configured to periodically toggle between the normal operation mode and the calibration mode to compensate for drift in the DC-DC converter.

7. The circuitry of claim 6 wherein the drift in the DC-DC converter is based on at least one of changes in an operating temperature of the DC-DC converter, changes in a normal operation setpoint of the DC-DC converter, and changes in a DC source voltage of the DC-DC converter.

8. The circuitry of claim 3 wherein:
a calibration circuit is configured to receive the switching control signal and provide the estimate of the current gain; and
the power supply control circuitry is further configured to compensate for drift in the DC-DC converter using at least one look-up table.

9. The circuitry of claim 8 wherein the drift in the DC-DC converter is based on at least one of changes in an operating temperature of the DC-DC converter, changes in a normal operation setpoint of the DC-DC converter, and changes in a DC source voltage of the DC-DC converter.

10. The circuitry of claim 8 wherein the calibration circuit is external to the DC-DC converter.

11. The circuitry of claim 2 wherein during the calibration mode, a calibration circuit is configured to receive the switching control signal and provide the estimate of the current gain.

12. The circuitry of claim 11 wherein the estimate of the current gain is further based on a frequency of the switching control signal during the calibration mode.

13. The circuitry of claim 12 wherein during the calibration mode:
the calibration circuit comprises a calibration frequency comparator and a calibration oscillator;
the calibration oscillator provides an oscillator output signal having a frequency based on an estimated current gain signal;
the calibration frequency comparator receives the oscillator output signal and the switching control signal, and provides the estimated current gain signal based on a frequency difference between the oscillator output signal and the switching control signal; and
the calibration frequency comparator and the calibration oscillator form a frequency locked loop, such that the estimated current gain signal is representative of the estimate of the current gain.

14. The circuitry of claim 2 wherein:
the parallel amplifier is further configured to during the normal operation mode, regulate the power supply output voltage based on a normal operation setpoint; and
the switching supply is further configured to drive the parallel amplifier output current toward zero using the switching control signal during both the calibration mode and the normal operation mode.

15. The circuitry of claim 2 wherein a DC power source is configured to provide a DC source signal to the DC-DC converter, such that the power supply output voltage is based on the DC source signal, which has a DC source voltage.

16. The circuitry of claim 15 wherein the calibration setpoint is equal to about one-half of a magnitude of the DC source voltage.

17. The circuitry of claim 15 wherein the DC power source is a battery.

18. The circuitry of claim 2 wherein:
the DC-DC converter has an output connection node;
the DC-DC converter is configured to provide a power supply output signal via the output connection node;
the power supply output signal has the power supply output voltage;
the open loop ripple cancellation circuit is coupled to the output connection node;
the parallel amplifier is coupled to the output connection node; and
the switching supply comprises a switching controller, switching circuitry, and a switching inductive element, such that the switching inductive element is coupled between the switching circuitry and the output connection node.

19. The circuitry of claim 18 wherein:
the switching controller is configured to provide the switching control signal to the switching circuitry;
during both the calibration mode and the normal operation mode, a frequency of the switching control signal is based on an inductance of the switching inductive element; and
during the calibration mode, the estimate of the current gain is based on the inductance of the switching inductive element.

20. The circuitry of claim 2 wherein during the normal operation mode, the open loop ripple cancellation circuit is further configured to operate using an operating current gain to approximately maximize cancellation of a ripple current at a desired ripple cancellation frequency.

21. The circuitry of claim 20 wherein the desired ripple cancellation frequency is equal to about 30 megahertz.

22. The circuitry of claim 20 wherein the desired ripple cancellation frequency is about equal to a radio frequency (RF) duplex frequency.

23. The circuitry of claim 2 wherein during the normal operation mode, the ripple cancellation current at least partially cancels a ripple current produced by the switching supply.

24. The circuitry of claim 2 wherein the open loop ripple cancellation circuit comprises a delay circuit, which is configured to during the normal operation mode, receive and delay the switching control signal to provide an input signal, such that the ripple cancellation current is based on the input signal.

25. The circuitry of claim 24 wherein the open loop ripple cancellation circuit further comprises a combined filter and operational transconductance amplifier (OTA), which is configured to during the normal operation mode, receive and high-pass filter the input signal to provide a derived output current, such that the ripple cancellation current is further based on the derived output current.

26. A method comprising:
    during a calibration mode, regulating a power supply output voltage based on a calibration setpoint using a parallel amplifier;
    driving a parallel amplifier output current toward zero using a switching supply based on a switching control signal, such that during the calibration mode, an estimate of a current gain is based on the switching control signal;
    during the calibration mode, disabling an open loop ripple cancellation circuit; and
    during a normal operation mode, providing a ripple cancellation current based on the estimate of the current gain.

* * * * *